United States Patent
Pietsch et al.

(10) Patent No.: US 11,914,293 B2
(45) Date of Patent: Feb. 27, 2024

(54) RADIATIOIN-CURABLE MIXTURE CONTAINING LOW-FUNCTIONALISED, PARTIALLY SAPONIFIED POLYVINYL ACETATE

(71) Applicant: Flint Group Germany GmbH, Stuttgart (DE)

(72) Inventors: Christian Pietsch, Offenburg (DE); Armin Becker, Großniedesheim (DE); Uwe Krauss, Gossersweiler-Stein (DE); Thomas Telser, Heidelberg-Wieblingen (DE)

(73) Assignee: Flint Group Germany GmbH, Stuttgart (DE)

( * ) Notice: Subject to any disclaimer, the term of this patent is extended or adjusted under 35 U.S.C. 154(b) by 1246 days.

(21) Appl. No.: 16/482,041

(22) PCT Filed: Jan. 26, 2018

(86) PCT No.: PCT/EP2018/051949
§ 371 (c)(1),
(2) Date: Jul. 30, 2019

(87) PCT Pub. No.: WO2018/141644
PCT Pub. Date: Aug. 9, 2018

(65) Prior Publication Data
US 2019/0391492 A1 Dec. 26, 2019

(30) Foreign Application Priority Data

Jan. 31, 2017 (EP) .................... 17153935

(51) Int. Cl.
| | |
|---|---|
| G03F 7/038 | (2006.01) |
| C08L 31/04 | (2006.01) |
| C08L 71/08 | (2006.01) |
| C08L 75/04 | (2006.01) |
| C08L 79/02 | (2006.01) |
| G03F 7/11 | (2006.01) |
| G03F 7/20 | (2006.01) |

(52) U.S. Cl.
CPC ............ *G03F 7/0388* (2013.01); *C08L 31/04* (2013.01); *C08L 71/08* (2013.01); *C08L 75/04* (2013.01); *C08L 79/02* (2013.01); *G03F 7/11* (2013.01); *G03F 7/202* (2013.01)

(58) Field of Classification Search
CPC ...... G03F 7/0388; G03F 7/11202; G03F 7/11; C08L 31/04; C08L 71/08; C08L 75/04; C08L 79/02
See application file for complete search history.

(56) References Cited

U.S. PATENT DOCUMENTS

| RE2,740 E | 8/1867 | Redway |
|---|---|---|
| 3,495,987 A | 2/1970 | Moore |
| 3,567,453 A | 3/1971 | Borden |
| 3,615,629 A | 10/1971 | Wilhelm et al. |
| 3,928,299 A | 12/1975 | Rosenkranz et al. |
| 4,272,611 A | 6/1981 | Vyvial et al. |
| 4,343,891 A | 8/1982 | Aasen et al. |
| 4,355,093 A | 10/1982 | Hartmann et al. |

(Continued)

FOREIGN PATENT DOCUMENTS

| AT | 326920 B | 1/1976 |
|---|---|---|
| CA | 933792 A | 9/1973 |

(Continued)

OTHER PUBLICATIONS

International Preliminary Examination Report for PCT/EP2018/051949 dated Jun. 6, 2019.

(Continued)

*Primary Examiner* — Geraldina Visconti
(74) *Attorney, Agent, or Firm* — Faegre Drinker Biddle & Reath LLP

(57) ABSTRACT

The invention relates to a radiation-curable mixture for generating relief structures, comprising a) at least one functionalized, part-hydrolyzed polyvinyl acetate comprising (i) vinyl alcohol units, (ii) vinyl acetate units, and (iii) vinyl acrylate units, where the vinyl acrylate units, which can be substituted, have the general structure

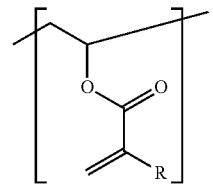

where R is hydrogen or a linear or branched aliphatic or heteroaliphatic radical having 1 to 12 carbon atoms, or a cycloaliphatic, heterocyclic or aromatic radical having 3 to 12 carbon atoms, as component A, b) at least one initiator as component B, c) at least one ethylenically unsaturated compound different from component A, as component C, d) one or more adjuvants as component D, wherein the amount of vinyl acrylate units (iii) in the functionalized, part-hydrolyzed polyvinyl acetate a), based on all the units (i), (ii), and (iii), is 0.1 to <3 mol %, and component D comprises an additive capable of hydrogen bonding, in an amount of 0.001 to 30 wt %, based on the sum of components A to D.

19 Claims, No Drawings

(56) References Cited

U.S. PATENT DOCUMENTS

| | | |
|---|---|---|
| 4,387,157 A | 6/1983 | Bronstert et al. |
| 4,504,573 A | 3/1985 | Ishikawa et al. |
| 4,517,277 A | 5/1985 | Lynch et al. |
| 4,540,743 A | 9/1985 | Schulz et al. |
| 4,554,240 A | 11/1985 | Schulz et al. |
| 4,590,287 A | 5/1986 | Riediker et al. |
| 4,713,401 A | 12/1987 | Riediker et al. |
| 4,743,528 A | 5/1988 | Farid et al. |
| 4,743,529 A | 5/1988 | Farid et al. |
| 4,743,530 A | 5/1988 | Farid et al. |
| 4,743,531 A | 5/1988 | Farid et al. |
| 4,784,872 A | 11/1988 | Moeller et al. |
| 4,857,654 A | 8/1989 | Riediker et al. |
| 4,957,852 A | 9/1990 | Bronstert |
| 5,026,625 A | 6/1991 | Riediker et al. |
| 5,262,275 A | 11/1993 | Fan |
| 6,020,108 A | 2/2000 | Goffing et al. |
| 6,368,772 B1 | 4/2002 | Telser et al. |
| 6,576,396 B1 | 6/2003 | Leichsenring et al. |
| 2013/0133537 A1 | 5/2013 | Wada |
| 2015/0205201 A1 | 7/2015 | Abura et al. |
| 2015/0367668 A1 | 12/2015 | Kawahara et al. |
| 2019/0391492 A1* | 12/2019 | Pietsch .................. C08L 31/04 |

FOREIGN PATENT DOCUMENTS

| | | |
|---|---|---|
| CN | 104508555 A | 4/2015 |
| CN | 104981355 A | 10/2015 |
| DE | 1522444 A1 | 7/1969 |
| DE | 2846647 A1 | 5/1980 |
| DE | 3015419 A1 | 10/1981 |
| DE | 3045516 A1 | 7/1982 |
| DE | 3322993 A1 | 1/1985 |
| DE | 3322994 A1 | 1/1985 |
| DE | 19933139 A1 | 1/2001 |
| EP | 0079514 A2 | 5/1983 |
| EP | 0085472 A1 | 8/1983 |
| EP | 109772 A2 | 5/1984 |
| EP | 109773 A2 | 5/1984 |
| EP | 0334338 A2 | 9/1989 |
| EP | 0504824 A1 | 9/1992 |
| EP | 0767406 A1 | 4/1997 |
| EP | 849635 A1 | 6/1998 |
| EP | 0962828 A1 | 12/1999 |
| JP | S45037377 B1 | 11/1970 |
| JP | S48007195 A | 1/1973 |
| JP | S48009005 B | 3/1973 |
| JP | 58-088742 A | 5/1983 |
| JP | S59152396 A | 8/1984 |
| JP | S59174831 A | 10/1984 |
| JP | S61151197 A | 7/1986 |
| JP | S6341484 A | 2/1988 |
| JP | S6314340 B2 | 3/1988 |
| JP | S63138345 A | 6/1988 |
| JP | S63142345 A | 6/1988 |
| JP | S63142346 A | 6/1988 |
| JP | S63143537 A | 6/1988 |
| JP | 64-029836 A | 1/1989 |
| JP | H01152109 A | 6/1989 |
| JP | H01304453 A | 12/1989 |
| JP | H02249 A | 1/1990 |
| JP | H024705 A | 1/1990 |
| JP | H06026223 B2 | 4/1994 |
| JP | 2000-128994 A | 5/2000 |
| JP | 2012-173368 A | 9/2012 |
| JP | 2013-111827 A | 6/2013 |
| WO | WO-9403838 A1 | 2/1994 |
| WO | WO-9403839 A1 | 2/1994 |

OTHER PUBLICATIONS

International Seach Report for PCT/EP2018/051949 dated Mar. 16, 2018.

Written Opinion of the International Seaching Authority for PCT/EP2018/051949 dated Mar. 16, 2018.

Chatterjee, S., et al., "Photochemisry of Carbocycanine Alkytriphenylborate Salts: Intra-Ion-Pair Electron Transfer and the Chemisty of Boranyl Radicals", Journal of Ameican Chemical Society, 1990, vol. 112, No. 17, pp. 6329-6338.

Davidson, R.S., "The chemistry of photoinitiators—some recent developments", J. Photochem. Photobiol. A: Chem., 1993, vol. 73, pp. 81-96.

Eaton, D.F., Journal Of the American Chemical Society, 1980, vol. 102:9, pp. 3278-3281.

Fouassier, J.P. "Photoinitiated Polymerisation—Theory and Applications", Rapra Review, Report Rapra Technology, 1998, vol. 9, pp. 1-23.

International Preliminary Report On Patentability for International Application No. PCT/EP2018/051949, dated Aug. 1, 2019.

Maslak, P., Fragmentations by Photoinduced Electron Transfer Fundamentals and Practical Aspects, Topics in Current Chemistry, 1993, vol. 168, pp. 1-46.

Monroe, B., Photoinitiators for Free-Radical-Initiated Photoimaging Systems, Chem. Rev., 1993, vol. 93, pp. 435-448.

Saeva, F., Photonduced Electron Transfer (PET) Bond Cleavage Reactions, Topics in Current Chemistry, 1990, vol. 156, pp. 59-92.

Shirai, M., et al., "Photoacid And Photobase Generators: Chemistry And Applications To Polymeric Materials", Prog. Polym. Sci., 1996, vol. 21, pp. 1-45.

Valet, A., "Lichtschutzmittel Für Lacke", Die Technologie des Beschictens, 1996, pp. 32-45.

Valet, A., "Lichtschutzmittel Für Lacke", Die Technologie des Beschictens, 1996, pp. 20-33.

* cited by examiner

RADIATIOIN-CURABLE MIXTURE CONTAINING LOW-FUNCTIONALISED, PARTIALLY SAPONIFIED POLYVINYL ACETATE

CROSS-REFERENCE TO RELATED APPLICATIONS

This application is a national stage application (under 35 U.S.C. § 371) of PCT/EP2018/051949, filed Jan. 26, 2018, which claims benefit of European Application No. 17153935.6, filed Jan. 31, 2017, both of which are incorporated herein by reference in their entirety.

The present invention relates to a radiation-curable mixture which comprises as essential constituents at least one water-soluble or water-dispersible, functionalized, part-hydrolyzed polyvinyl acetate, at least one photopolymerization initiator, one or more ethylenically unsaturated, photopolymerizable, low molecular mass compounds compatible with the part-hydrolyzed polyvinyl acetate, and also further adjuvants. It further relates to radiation-curable multilayer elements comprising the radiation-sensitive mixture, and to the use thereof.

The production of a relief structure is achieved in general by means of the following steps: a radiation-curable mixture is applied in a fluid form to a dimensionally stable carrier, where it is solidified and subject to imagewise exposure (by using a mask or by writing with a light beam). As a result of the exposure to light, the exposed regions are crosslinked and so become insoluble or infusible. In a subsequent developing step, the unexposed, uncured regions are removed and hence a relief structure is generated. In the case of part-hydrolyzed polyvinyl acetates, the unexposed regions are removed by washing with water or an aqueous washing composition. This is generally followed by an additional step of drying.

The preparation of part-hydrolyzed functionalized polyvinyl acetates is known and described for example in USRE2740, DE 3015419, EP 0079514, DE 3322993, DE 3322994, EP 849635, and EP 962828. Radiation-curable mixtures and relief structures generated from them are likewise known and described for example in DE 3015419, EP 0079514, DE 3322993, DE 3322994, EP 849635, and EP962828. DE3015419 describes the use of functionalized, part-hydrolyzed polyvinyl acetates in an adhesion-promoting interlayer between substrate and radiation-sensitive layer. EP 0079514 shows the use of functionalized, part-hydrolyzed polyvinyl acetates, obtained by means of an excess of functionalizing agent, in relief structures, with the objective of improving the stability on drying. DE 3322993 and DE 3322994 describe an improved preparation process for functionalized, part-hydrolyzed polyvinyl acetates, through the use of catalysts, and describe the use of the functionalized, part-hydrolyzed polyvinyl acetates for generating relief structures. EP 849635 describes a radiation-curable mixture comprising two different binders, one of which is a functionalized, part-hydrolyzed polyvinyl acetate with a high degree of functionalization. EP 962828 describes a further improvement in the synthesis of functionalized, part-hydrolyzed polyvinyl acetates, and the use thereof in radiation-curable mixtures for generating relief structures.

The relief structures described, however, have deficiencies. Properties deserving of improvement include the curling, the low elongation at break, and the low elasticity of the relief structures. The curling is manifested in the relief structures, some time after development, beginning to roll themselves up from the edges in the direction of the side facing away from the substrate; this makes the further use of the relief structures more difficult, hindering particularly their mounting onto a printing cylinder, and can lead to the formation of cracks.

It is an object of the invention to provide radiation-curable mixtures with reduced curling of the relief structures obtained from them. A particular object of the invention is to provide mixtures of this kind which feature enhanced elongation at break and elasticity of the relief structures generated from them. At the same time, the exposure times of the radiation-curable mixtures and the washout times during the development of the relief structures are to remain the same or even be shortened. A further object of the invention is to generate relief structures which hold low halftone tonal values (highlights) more effectively and image them in the print.

it has now emerged that the curling of the relief structures can be reduced significantly, and their mechanical properties improved, if functionalized, part-hydrolyzed vinyl acetate polymers having a low fraction (<3 mol %) of vinyl acrylate units are used in the radiation-curable mixture.

The object is therefore achieved by a radiation-curable mixture for generating relief structures, comprising a) at least one functionalized, part-hydrolyzed polyvinyl acetate comprising (i) vinyl alcohol units, (ii) vinyl acetate units, and (iii) vinyl acrylate units, where the vinyl acrylate units, which can be substituted, have the general structure

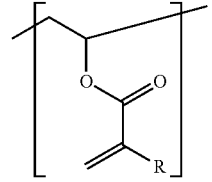

where R is hydrogen or a linear or branched aliphatic or heteroaliphatic radical having 1 to 12 carbon atoms, or a cycloaliphatic, heterocyclic or aromatic radical having 3 to 12 carbon atoms, as component A, b) at least one initiator as component B, c) at least one ethylenically unsaturated compound different from component A, as component C, d) optionally one or more adjuvants as component D, wherein the amount of vinyl acrylate units (iii) in the functionalized, part-hydrolyzed polyvinyl acetate a), based on all the units (i), (ii), and (iii), is 0.1 to <3 mol %, and component D comprises an additive capable of hydrogen bonding, in an amount of 1 to 30 wt %, based on the sum of components A to D.

Preferred aliphatic radicals R are linear or branched $C_1$-$C_{12}$ alkyl optionally substituted by at least one halogen, hydroxyl, mercapto, ether, amine, carboxylic acid, ester, urethane, aldehyde, nitro, $CF_3$ or cyano group, more preferably optionally substituted $C_1$-$C_4$ alkyl, such as methyl, ethyl, propyl, isopropyl, butyl, isobutyl, sec-butyl, tert-butyl or N-acetyl, $CH_2$—Br, more particularly methyl, ethyl, and $CH_2$—COOH, especially methyl.

Preferred cycloaliphatic radicals, optionally with a halogen, hydroxyl, mercapto, ether, amine, carboxylic acid, ester, urethane, aldehyde, nitro, $CF_3$ or cyano group, are cyclohexyl, cyclopentyl, cyclobutyl, cyclopropyl, cyclopentadiene, decalin, adamantane, and camphor radicals.

Preferred heterocyclic radicals, optionally with a halogen, hydroxyl, mercapto, ether, amine, carboxylic acid, ester, urethane, aldehyde, nitro, $CF_3$ or cyano group, are 2-pyrrolidine, tetrahydrofuran, tetrahydrothiophene, pyran, thiopyran, pyrazole, imidazole, piperidine, and morpholine radicals.

Preferred aromatic or heteroaromatic radicals, optionally with a halogen, hydroxyl, mercapto, ether, amine, carboxylic acid, ester, urethane, aldehyde, nitro, $CF_3$ or cyano group, are phenyl, benzyl, pyridine, naphthyl, pyrrole, furan, thiophene, pyridine, pyrazole, benzimidazole, indole, isoquinoline, purine, pyrimidine, oxazole, and thioazole radicals.

The vinyl alcohol, vinyl acetate, and vinyl acrylate units are of course in a form copolymerized in the polymer. The fraction of the vinyl monomer units is expressed in mol %, based on all the vinyl alcohol, vinyl acetate, and, optionally substituted vinyl acrylate units of the polymer. The fraction of the optionally substituted vinyl acrylate units is in general 0.2 to <3 mol %, for example 0.2 to 2.9 mol %, preferably 0.5 to <3 mol %, for example 0.5 to 2.9 mol %, more preferably 1 to <3 mol %, for example 1 to 2.9 mol %, very preferably 1 to 2.5 mol %, but also preferably 0.1 to 2.5 mol % or 0.2 to 2.5 mol % or 0.5 to 2.5 mol %, Especially preferred optionally substituted vinyl acrylate units are vinyl acrylate, vinyl methacrylate, vinyl 2-ethylacrylate, vinyl 2-propylacrylate, vinyl 2-butylacrylate, and vinylitaconic acid ($R=CH_2$—COOH). More particularly preferred are vinyl acrylate ($R=H$) and vinyl methacrylate ($R=CH_3$), abbreviated as vinyl (meth)acrylate.

The amount of vinyl alcohol units in the polymer is generally 65 to 95 mol %, preferably 70 to 90 mol %, and more preferably 80 to 85 mol %, based on all the units.

The amount of vinyl acetate units in the polymer is generally 5 to 35 mol %, more preferably 10 to 30 mol %, and especially preferably 10 to 20 mol %, and more particularly in the range of 15-20 mol %, based on all the units.

Generally speaking, the ratio of the vinyl alcohol units to the optionally substituted vinyl acrylate units is 20:1 to 400:1, preferably 10:1 to 100:1, more preferably 25:1 to 85:1. Generally speaking, the ratio of the vinyl acetate units to the optionally substituted vinyl acrylate units is 5:1 to 50:1, preferably 5:1 to 30:1, and more preferably 5:1 to 20:1.

The functionalized, part-hydrolyzed polyvinyl acetates present in the radiation-curable mixture generally have a viscosity, measured at a temperature of 20° C. on a 4% aqueous solution using a falling-ball viscometer, in the range from 0.5 mPas to 250 mPas. The viscosity is preferably 2 mPas to 50 mPas, more preferably 2 mPas to 40 mPas.

Generally speaking, the radiation-curable mixture comprises the functionalized, part-hydrolyzed polyvinyl acetates in an amount of 5 to 75 wt %, preferably 5 to 60 wt %, more preferably 5 to 50 wt %, based on the sum of all components A to D of the radiation-curable mixture.

The radiation-curable mixture further comprises as component B one or more polymerization initiators. Suitability is possessed by initiators or initiator systems made up of at least 2 components which on irradiation with electromagnetic waves generate radicals which bring about polymerization and/or crosslinking. Initiators of these kinds are known to the skilled person and described for example in the following references: Bruce M. Monroe et al., Chemical Review, 93, 435 (1993), R. S. Davidson, Journal of Photochemistry and Biology A: Chemistry, 73, 81 (1993), J. P. Faussier, Photoinitiated Polymerization-Theory and Applications: Rapra Review, Vol. 9, Report, RapraTechnology (1998); M. Tsunooka et al., 25 Prog. Polym. Sci., 21, 1 (1996), F. D. Saeva, Topics in Current Chemistry, 1 56, 59 (1990), G. G. Maslak, Topics in Current Chemistry, 168, 1 (1993), H. B. Shuster et al., JAGS, 112, 6329 (1990) and I. D. F. Eaton et al., JAGS, 102, 3298 (1980), P. Fouassier and J. F. Rabek, Radiation Curing in Polymer Science and Technology, pages 77 to 117 (1993) or K.K. Dietliker, Photoinitiators for free Radical and Cationic Polymerisation, Chemistry & Technology of UV & EB Formulation for Coatings, Inks and Paints, Volume, 3, Sita Technology LTD, London 1991; or R.S. Davidson, Exploring the Science, Technology and Applications of U.V. and E.B. Curing, Sita Technology LTD, London 1999. Further initiators are described in JP45-37377, JP44-86516, U.S. Pat. Nos. 3,567,453, 4,343,891, EP109772, EP109773, JP63138345, JP63142345, JP63142346, JP63143537, JP4642363, JP59152396, JP61151197, JP6341484, JP2249 and JP24705, JP626223, JPB6314340, JP1559174831, JP1304453, and JP1152109.

Preferred initiators or initiator systems made up of at least 2 components are those which come from the group of the initiators, generally as Norrish type I or Norrish type II, which are based on H abstraction or electron transfer. The Norrish type I initiators include, for example, benzoyl radical-forming initiators, α-hydroxyketones, α-aminoketones, acylphosphine oxides, bisacylphosphine oxides, triazines, and hexaarylbisimidazoles, which may additionally be combined with dyes or sensitizers to increase the sensitivity. The Norrish type II initiators are, in particular, combinations of ketones or aldehydes with H-transfer agents such as, for example, amines or thiols. The initiators are preferably selected from the group consisting of benzil dimethyl ketal, diphenyl(2,4,6-trimethylbenzoyl)phosphine oxide, 2,4,6-trimethylbenzoylphenyl phosphinate, bis(2,4,6-trimethylbenzoyl)phenylphosphine oxide, bis(2,6-dimethoxybenzoyl)-2,-1,4-trimethylpentyl) phosphine oxide, Michler's ketone, and benzophenone, alone and/or in combination with sensitizers, amines or thiols, and any desired combinations thereof. Further initiators which can be used are onium salts, organic peroxides, thio compounds, ketoximes, borates, azinium compounds and azo compounds, metallocenes and compounds having a carbon-halogen group, which may likewise be used in combination or together with sensitizers, amines or thiols. Examples of the sensitizers which can be used are xanthones, thioxanthones, anthracenes, perylenes, phenothiazines, benzophenones, acetophenones, and dyes. A requirement for sensitization is either that the triplet energy of the sensitizer is higher than that of the initiator to be sensitized, or that an electron transfer from an excited state of the sensitizer is possible.

The wavelength of the irradiated electromagnetic radiation here is in the range from 200 to 2000 nm, preferably in the UV range, more preferably in the range from 250 to 550 nm, very preferably in the range from 300 to 450 nm. Besides broad-spectrum irradiation of the electromagnetic waves, it may be advantageous to use narrow-spectrum or monochromatic wavelength ranges, of the kind which can be generated using corresponding filters, lasers or light-emitting diodes (LEDs). In these cases, wavelengths in the ranges of 350, 365, 385, 395, 400, 405, 532, 830, and 1064 nm, individually (and around 5-10 nm above and/or below) or as combinations, are preferred.

The initiators or initiator combinations have at least one absorption maximum within these wavelength ranges; it is not necessary for the position of the absorption maximum to coincide with the emission maximum of the electromagnetic radiation, but it is advantageous if the two maxima overlap to a very high degree.

Generally speaking, the radiation-curable mixture comprises the initiator or the initiator system in amounts of 0.1 to 20 wt %, based on the overall formulation. The initiator concentration is preferably 0.1 to 10 wt %, more preferably 0.1 to 5 wt %, very preferably 0.5 to 5 wt %, based on the sum of all the components A to D.

As component C, the radiation-curable mixture comprises low molecular weight, ethylenically unsaturated compound different from component A and having at least one ethylenically unsaturated group. Ethylenically unsaturated compounds contemplated are those which are compatible with the polymeric binder(s) of component A. The ethylenically unsaturated compound preferably contains at least 2 ethylenically unsaturated groups, more preferably 2 to 6 ethylenically unsaturated groups, very preferably exactly 2 ethylenically unsaturated groups. Compounds having C—C triple bonds may also be used in the radiation-curable mixture. The at least one ethylenically unsaturated group is preferably an acrylate and/or a methacrylate group, although acrylamides, vinyl ethers or styrene derivatives may also be employed as ethylenically unsaturated compounds. The ethylenically unsaturated compound may be a monomeric, oligomeric or polymeric ethylenically unsaturated compound, and may have a linear, branched, star-shaped or dendritic structure. The low molecular weight, ethylenically unsaturated compounds of component C have a molecular weight of less than 5000 g/mol. The molecular weight is preferably less than 3000 g/mol, more preferably less than 1000 g/mol, very preferably less than 500 g/mol, and may even be less than 300 g/mol. Generally speaking, the molecular weight of the low molecular weight ethylenically unsaturated compounds is at least 86.

Preference is given to derivatives of acrylic and/or methacrylic acid, such as their esters with mono- or polyhydric alcohols, examples being acrylic or methacrylic esters of alkanols having 1 to 20 carbon atoms, such as methyl methacrylate, ethyl acrylate, propyl (meth)acrylate, isopropyl (meth)acrylate, n-butyl (meth)acrylate, isobutyl (meth)acrylate, tert-butyl (meth)acrylate, hexyl (meth)acrylate, cyclohexyl (meth)acrylate, 2-ethylhexyl (meth)acrylate, lauryl (meth)acrylate, (meth)acrylic esters of polyhydric alcohols having 2 to 20 carbon atoms, e.g., 2-hydroxyethyl (meth)acrylate, 2-hydroxypropyl (meth)acrylate, ethylene glycol di(meth)acrylate, polyethylene glycol di(meth)acrylate, butane-1,4-diol di(meth)acrylate, neopentyl glycol di(meth)acrylate, 3-methylpentanediol di(meth)acrylate, 1,1,1-trimethylolpropane tri(meth)acrylate, 1,4-butanediol diacrylate, 1,6-hexanediol diacrylate, 1,6-hexanediol dimethacrylate, 1,9-nonanediol diacrylate, di-, tri-, and tetraethylene glycol di(meth)acrylate, tripropylene glycol di(meth)acrylate or pentaerythritol tetra(meth)acrylate, and additionally poly(ethylene oxide) di(meth)acrylate, m-methylpoly(ethylene oxide)-yl (meth)acrylate, N,N-diethylaminoethyl acrylate, a reaction product of 1 mol of glycerol, 1 mol of epichlorohydrin, and 3 mol of acrylic acid, and also glycidyl methacrylate and bisphenol A diglycidyl ether acrylate. (Meth)acrylic acid derivatives with carboxylic acid and/or amino groups.

Also suitable are derivatives of acrylamide and of methacrylamide, such as, for example, ethers of their N-methylol derivatives with mono- and polyhydric alcohols, e.g., ethylene glycol, glycerol, 1,1,1-trimethylolpropane, oligomeric or polymeric ethylene oxide derivatives. These are suitable particularly if polyamides or polyvinyl alcohol are used as binders.

Also suitable are so-called epoxy (meth)acrylates and urethane (meth)acrylates, of the kind obtainable for example by reaction of bisphenol A diglycidyl ether with (meth)acrylic acid or by reaction of diisocyanates with hydroxyalkyl (meth)acrylates or with hydroxyl-containing polyesters or polyethers. Other olefinically unsaturated compounds which can be used are esters of acrylic acid or methacrylic acid, especially those with a low vapor pressure and those modified with compatibilizers, e.g., with hydroxyl, amido, sulfoester or sulfonamide groups. Mixtures of the abovementioned copolymerizable, ethylenically unsaturated, organic compounds may also be used.

Preferably ethylenically unsaturated compounds of low molecular weight are phenyl glycidyl ether acrylate, glycerol dimethacrylate, 1,4-butanediyl bis[oxy(2-hydroxy-3,1-propanediyl)] diacrylate, 2-hydroxyethyl methacrylate, 2,3-epoxypropyl methacrylate, ethyl diglycol acrylate, hydroxypropyl acrylate, butanediol diacrylate, triethylene glycol diacrylate, bisphenol A diglycidyl ether diacrylate, 2-(dimethylamino)ethyl methacrylate, tert-butylaminoethyl methacrylate, tert-butyl acrylate, polyethylene glycol methacrylate, benzyl acrylate, tetrahydrofurfuryl acrylate, phenoxymethyl methacrylate, vinylpyrrolidone, and vinyl acetate, and also the corresponding methacrylates, Particularly preferred are . . . phenyl glycidyl ether acrylate, glycerol diacrylate, 1,4-butanediyl bis[oxy(2-hydroxy-3,1-propanediyl)] diacrylate, ethylene diacrylate, 2-hydroxyethyl methacrylate, butanediol diacrylate, hexanediol diacrylate, and also the corresponding methacrylates.

In one embodiment, component C comprises phenyl glycidyl ether acrylate.

Generally speaking, the ethylenically unsaturated compound is present in amounts of 0.5 to 50 wt %, preferably of 1 to 40 wt %, more preferably of 5 to 40 wt %, very preferably in the range from 10 to 40 wt %, based on the sum of components A to D of the formulation.

Generally speaking, the radiation-curable mixture comprises one or more adjuvants selected from the group consisting of plasticizers, solvents, further polymeric binders, colorants, stabilizers (inhibitors), chain transfer agents, UV absorbers, dispersing assistants, organic or inorganic fillers, further, nonradical crosslinkers, viscosity modifiers, and hydrogen bond-accepting additives. These adjuvants are present in the radiation-curable mixtures in a total amount in the range from 0.001 to 50 wt %, based on the overall formulation. They are preferably present in total in amounts of 0.01 to 40 wt %, more preferably 0.1 to 30 wt %, and very preferably of 1 to 20 wt %, based on the sum of components A to D. The individual additives here are included in concentrations of 0.001 to 30 wt %, preferably in the range from 0.001 to 20 wt %, more preferably in the range from 0.001 to 10 wt %, and very preferably in the range from 0.001 to 5 wt %, based on the overall formulation.

The radiation-curable mixture in one embodiment may comprise plasticizers, such as, for example, polyethylene glycols, glycerol, ethylene glycol, N-alkylbenzenesulfonamides, phthalates, and any desired mixtures thereof. Examples of suitable plasticizers are aliphthalic acid esters, e.g., dimethyl phthalate, diethyl phthalate, dibutyl phthalate, diisobutyl phthalate, diocyl phthalate, octyl caprylyl phthalate, dicyclohexyl phthalate, ditridecyl phthalates, butyl benzyl phthalate, diisodecyl phthalates or diallyl phthalates; glycol esters, e.g., dimethyl glycol phthalates, ethyl phthalylethylglycolate, methyl phthalylethylglycolate, butyl phthalylbutylglycolate or triethylene glycol dicaprylic ester; phosphoric-acid esters, e.g., tricresyl phosphate or triphenyl phosphate; aliphatic diesters, e.g., diisobutyl adipate, dioctyl adipate, dimethyl sebacetate, dibutyl sebacetate, dioctyl azelate or dibutyl maleate; pentaerythritol polyoxyethylene ethers; polyglycidyl methacrylate; triethyl citrate; glycerol triacetyl ester, and butyl laurate. The plasticizer content is generally 1 to 30 wt %, preferably 1 to 20 wt %, more preferably 1 to 10 wt %, and very preferably 3 to 10 wt %, based on the weight of the overall formulation.

As further binders different from component A, suitability is possessed by completely or partially hydrolyzed polyvinyl esters, e.g., part-hydrolyzed polyvinyl acetates, polyvinyl alcohol derivatives, such as part-hydrolyzed vinyl acetate/alkylene oxide graft copolymer, and also mixtures thereof. Also suitable as polymeric binders are polyamides soluble in water or water/alcohol mixtures, of the kind described in EP 0 085 472 or in DE 1522444, for example. The concentration of the further binders, if present, is generally in the range from 1 to 50 wt %, preferably in the range from 1 to 40 wt %, more preferably in the range from 1 to 35 wt %, and very preferably in the range from 1 to 30 wt %, based on the overall formulation.

It is additionally possible to add inhibitors to thermal polymerization that exhibit no notable absorption of their own in the actinic range in which the photoinitiator is absorbed; examples include 2,6-di-tert-butyl-p-cresol, hydroquinone, p-methoxyphenol, β-naphthol, phenothiazine, pyridine, nitrobenzene, m-dinitrobenzene or chloranil; thiazine dyes, such as thionine blue G (C.I. 52025), methylene blue B (C.I. 52015) or toluidine blue (C.I. 52040); or N-nitrosamines, such as N-nitrosodiphenylamine, or the salts—for example, the potassium, calcium or aluminum salts—of N-nitrosocyclohexylhydroxylamine. Other suitable inhibitors and stabilizers are described for example in A. Valet, Lichtschutzmittel für Lacke, 33ff, Vincentz Verlag Hannover 1996. Particularly preferred are sterically hindered phenols and amines.

Colorants added may be dyes, pigments or photochromic additions to the radiation-curable mixture in an amount of 0.0001 to 2 wt %, based on the mixture. They serve to control the exposure properties, as chain transfer agents, for identification, for direct control of the exposure outcome, or for esthetics. Suitability is possessed, for example, by the soluble phenazinium, phenoxazinium, acridinium, and phenothiazinium dyes, such as neutral red (C.I. 50040), safranin T (C.I. 50240), rhodanil blue, the salt or amide of rhodamine D (Basic Violet 10, C.I. 45170), methylene blue B (C.I. 52015), thionine blue G (C.I. 52025), acriflavin (C.I. 46000), acridine orange (C.I. 46005) or Solvent Black 3 (C.I. 26150). These dyes may also be used together with a reducing agent which does not reduce the dye in the absence of actinic light but on exposure is able to reduce the dye in the excited electronic state. Examples of such mild reducing agents are ascorbic acid, anethole, thiourea, e.g., diethylallylthiourea, especially N-allylthiourea, and also hydroxylamine derivatives, especially salts of N-nitrosocyclohexylhydroxylamine, preferably the potassium, calcium, and aluminum salts. The latter are able, as mentioned, to act also as inhibitors of thermally initiated polymerization. The reducing agents may be added in general in amounts of 0.005 to 5 wt %, based on the mixture, and in many cases the addition of 3 to 10 times the amount of dye used concomitantly has been found appropriate.

Chain transfer agents are, for example, hydroxylamine derivatives, especially salts of N-nitrosocyclohexylhydroxylamine, preferably the potassium, calcium, and aluminum salts, or —SH-containing compounds such as mercaptoethanol, mercaptopropanol, thiophenol, thioglycerol, ethyl thioglycolate, methyl thioglycolate, dodecyl mercaptan or mercaptoacetic acid, organic halogen compounds, such as tetrachloromethane.

The addition of UV absorbers in the radiation-curable mixture may likewise have advantages and have a positive influence on the formation of relief. UV absorbers employed are compounds such as, for example, hydroxyphenylbenzotriazoles, hydroxybenzophenones, hydroxyphenyl-s-triazines, oxalanilides, hydroxyphenylpyrimidines, salicylic acid derivatives, and cyanoacrylates, as described in A. Valet, Lichtschutzmittel für Lacke, 20ff, Vincentz Verlag Hannover 1996, and any desired combinations thereof.

It is possible, furthermore, for dispersing assistants which have dispersing properties for pigments, dyes, nanoparticles or inorganic fillers to be present, such as, for example, mono- and polyfunctional carboxylic or sulfonic acids, alcohols or amines. As additional, non-radically crosslinking crosslinkers it is possible to use mono- and polyfunctional aldehydes, polyfunctional epoxides, polyfunctional carboxylic acids, and polyfunctional carboxylic anhydrides, and any desired combinations, in the radiation-curable mixture. These include, in particular, formaldehyde, acetaldehyde, propylaldehyde, valeraldehyde, caproaldehyde, pivalaldehyde, glyoxal, glutaraldehyde (1,5-pentanedial), succinaldehyde (butanedial), terephthalaldehyde, 1,2,3,4-diepoxybutane, 1,2:5,6-diepoxyhexane, 1,2:7,8-diepoxyoctane, epoxy resins, such as bisphenol A diglycidyl ether and epoxyphenol novolacs, oxalic acid, malonic acid, succinic acid, glutaric acid, adipic acid, pimelic acid, suberic acid, azelaic acid, sebacic acid, tartaric acid, citric acid, terephthalic acid, phthalic acid, aspartic acid, glutamic acid, maleic anhydride, succinic anhydride, and phthalic anhydride.

Viscosity modifiers employed in the radiation-sensitive mixture, besides water-soluble or dispersible polymers, are also surfactants or surface-active substances.

In one embodiment the radiation-sensitive mixture comprises at least one additive of low or high molecular weight that is capable of forming hydrogen bonds. This is a compound which forms hydrogen bonds with the component A and is selected from the group consisting of alcohols, ketones, aldehydes, amines, amides, amino acids, carboxylic acids, thioethers, thiols, urethanes, esters, lactones, lactams, and any desired combinations thereof. The hydrogen bond-forming additive is preferably selected from the group consisting of polyols, polyamines, polyethers, polyesters, polyamides, and ionic polymers, examples being anionic polymers such as polystyrenesulfonic acid. Particularly preferred as hydrogen bond-accepting additive are polyethyleneimine, polyurethanes having ethylene glycol units (such as, for example, polyurethane acrylate PUA BIN 200 from BASF), polyethylene glycol, such as PEG-400 and PEG-2000, and also polyvinyl alcohol/polyethylene glycol graft copolymers such as Alcotex 97-5, and any desired combinations thereof. In one specific embodiment of the invention the hydrogen bond-forming additive is a polyvinyl alcohol/polyethylene glycol graft copolymer.

The additive capable of forming hydrogen bonds is present in general in an amount of 1 to 30 wt %, preferably 1 to 25 wt %, more preferably 5 to 20 wt %, and very preferably 10 to 20 wt %, based on the overall formulation.

Preferred radiation-curable mixtures comprise
a) 5 to 75 wt % of component A
b) 0.1 to 20 wt % of component B,
c) 0.5 to 50 wt % of component C,
d) 0.001 to 50 wt % of component D.

In one embodiment the radiation-curable mixtures comprise 1 to 50 wt % of component D, of which 1 to 30 wt % is accounted for by an additive capable of forming hydrogen bonds.

In one particularly preferred embodiment the radiation-curable mixtures comprise a) 5 to 60 wt % of component A
b) 0.1 to 10 wt % of component B,
c) 1 to 40 wt % of component C,
d) 0.01 to 40 wt % of component D.

In one embodiment the radiation-curable mixtures comprise 1 to 40 wt % of component D, of which 1 to 25 wt % is accounted for by an additive capable of forming hydrogen bonds.

The radiation-sensitive mixture may be produced by any methods familiar to the skilled person, by mixing, dissolving, dispersing, emulsifying or any desired combinations thereof. The sequence in which the individual components are added is not critical, though it may be advantageous to combine certain components in part-mixtures, before then combining the part-mixtures to form the completed mixture. In these steps it is also possible for solvents to be employed which, however, are removed again at least in part-steps and at least partially, preferably very largely, so that the radiation-sensitive mixture is in a dry and optionally solid form, preferably the form of a film or coat. In this case, small amounts or traces may remain in the radiation-curable mixture. The radiation-sensitive mixture may be applied by the customary methods (e.g., pouring, knife coating, spraying, dipping) to substrates or coats, and may be subjected to further steps (drying, evaporating, extruding, calendering, laminating, lining). Solvents are removed and, where appropriate, used again, using the known methods (e.g., drying, distilling, removal on a rotary evaporator; aforesaid methods may be carried out at atmospheric pressure and/or super- and/or subatmospheric pressure; decanting). In one embodiment, the radiation-curable mixture may be applied to a carrier foil or protective foil, being for example poured, dried, and then laminated onto the metallic or polymeric carrier, in which case solvents may also be employed. Solvents which can be used are polar solvents, especially water and aqueous solutions, alcohols, ketones, and aldehydes, and also any desired mixtures thereof.

The invention further relates to a radiation-curable multilayer element at least comprising a layer of the radiation-curable mixture as relief-forming layer on a carrier. The radiation-curable multilayer element may comprise further layers.

The thickness of the radiation-curable layer is generally 0.01 to 5 mm, preferably 0.01 to 4 mm, more preferably 0.02 to 3 mm, and very preferably 0.03 mm to 3 mm.

The carrier, composed of a dimensionally stable carrier material, may optionally comprise further layers, examples being an adhesion coating layer, top coating layer or barrier layer, which are located between the dimensionally stable carrier and the radiation-curable, relief-forming layer; one layer here may also have two or more of the stated functions. Examples of suitable dimensionally stable carriers are plates, foils, and also conical and cylindrical tubes, known as sleeves, made of metals such as steel, aluminum, copper or nickel, or of plastics such as polyethylene terephthalate, polybutylene terephthalate, polyamide or polycarbonate, of wovens or nonwovens such as woven glass fiber fabric, or of composite materials composed of glass fibers and plastics. Particularly suitable as dimensionally stable carriers are dimensionally stable carrier foils or metal sheets, examples being polyethylene or polyester foils or steel or aluminum sheets. These carrier foils or metal sheets have a thickness, generally speaking, of 50 to 1500 µm, preferably 75 to 400 µm, for example around 250 µm. If steel is used as carrier material, steel sheets having a thickness of 0.05 to 0.3 mm are preferred. For protection against corrosion, preference is given to using tin-plated steel sheets. These carrier foils or carrier sheets may be coated with a thin, adhesion-promoting layer, for example a layer 0.1 µm to 2 µm thick, on the side of the carrier foil facing the radiation-curable, relief-forming layer.

On the dimensionally stable carrier there may be an adhesion coating layer and optionally a top coating layer. Acting as adhesion coating layers may be, for example, layers of polyurethane adhesion coating materials, e.g., in accordance with DE3045516, based on polyisocyanate-crosslinked polyether or polyester coating materials, in layer thicknesses of between 0.5 and 50 µm, more particularly between 2 and 30 µm.

Top coating layers may be located on the side of the adhesion coating layer facing away from the carrier layer, and generally have layer thicknesses of between 0.1 and 50, more particularly 1 and 10, µm, and may be obtained, for example, by application of a dilute aqueous-alcoholic solution of part-hydrolyzed (hydrolyzed, for example, to an extent of 80%) polyvinyl ester, phenylglycerol ether monoacrylate (2-hydroxy-3-phenoxypropyl acrylate), and glyoxal, and by drying and baking of the top coating layer.

The adhesion in the exposed or unexposed state between the dimensionally stable carriers and the substrate layer ought to be greater than 0.5 N/cm on measurement in a peel test at a peel angle of 90° with a peeling velocity of 30 mm/min.

Barrier layers or protective layers may be present in order to protect the radiation-curable, relief-forming layer from environmental effects such as light, moisture, oxygen or ozone, for example. It is, however, also possible to unite different barrier properties in one layer. The barrier layer may be a separate barrier layer or else may be the carrier layer which has corresponding barrier properties.

Barrier layers against light may consist of plastics which themselves absorb or reflect corresponding wavelengths—for example, of polyethylene naphthalate, which absorbs in the UV range—or may comprise materials which absorb or reflect the corresponding wavelengths, as described in EP0504824 and EP0767406, for example.

Barrier layers against moisture may consist of polymers which exhibit a low diffusion coefficient for water. Examples are polyethylenes, polypropylenes, polyesters, and polyvinyl alcohols.

Barrier layers against oxygen may play a large part on subsequent exposure to electromagnetic waves, since reactions which proceed radically are greatly influenced and braked by oxygen. Materials proposed for barrier layers include both water-soluble binders and binders soluble in organic solvents, these binders being polyamides, polyvinyl alcohols, hydroxyalkylcelluloses, ethylene-vinyl acetate copolymers, amphoteric interpolymers, cellulose acetate butyrate, alkylcellullose, butyral, cyclic rubbers, and combinations thereof. Preference is given to using polyvinyl alcohol, part-hydrolyzed and highly hydrolyzed polyvinyl carboxylate, poly(ethylene oxide-vinyl alcohol) graft copolymers or poly(ethylene vinyl alcohol) copolymers. The thickness of the barrier layer is in general 0.2 µm to 10 µm, preferably 0.3 to 8 µm.

The radiation-curable multilayer element on the radiation-curable, relief-forming layer preferably comprises one or more further layers. These further layers may be a protective layer, a barrier layer, a mask layer, an adhesion layer, a release layer (disbonding layer), or a layer for generating a surface structure; one layer may also have two or more of the stated functions, and these layers may be present in any desired orders and combinations. Layers which are removed not mechanically, by being peeled off, for example, are in general at least partially water-soluble or water-dispersible.

As outermost layer, the radiation-curable multilayer element in general comprises a protective layer, preferably a protective foil, which protects the radiation-curable layer from mechanical damage, caused by scratches, dirt or dust, for example. This protective layer is removed in general before further processing steps. Generally speaking, the protective layer is a thin and preferably likewise dimensionally stable polymeric foil made of polyesters, e.g., polyethylene terephthalate or polybutylene terephthalate), polyamides, polyurethanes or polyethylene. To protect the radiation-curable layer from light, the protective layer may also comprise light-absorbing materials and may therefore prevent premature unwanted polymerization in the radiation-curable layer.

The barrier layer is generally located in direct contact with the radiation-curable layer and prevents unwanted low molecular weight substances from the environment (e.g., moisture, oxygen, or ozone or combinations thereof) or from other layers (e.g., dyes, UV absorbers) from diffusing into the radiation-curable layer, or it prevents low molecular weight substances diffusing from the radiation-curable layer (e.g., initiator, monomer) into the layers situated above it. Other arrangements in which the barrier layer is positioned elsewhere, or two or more barrier layers are employed, are likewise possible. Suitable barrier layers against moisture, light and oxygen are the barrier layers described above.

Barrier layers against constituents of the radiation-curable layer and/or of the layer situated above the barrier layer have a high diffusion resistance with respect to the migrating substances. Generally speaking, the barrier layers are at least partially water-soluble or water-dispersible.

Adhesion layers increase the adhesion between individual layers and stabilize the layer construction. Such layers comprise substances which exhibit an interaction with both bordering layers, these substances generally being surfactants, amphiphilic molecules having hydrophobic and hydrophilic regions, and block copolymers, and oligomers which comprise blocks that are compatible with the two layers or with the polymers in the bordering layers.

Release layers reduce the adhesion between individual layers and facilitate, for example, the removal of another layer by peeling, such as of a protective foil, for example. These layers may be located at any of a very wide variety of different positions in the layer construction, and may be used for the simple removal of one or more layers.

A layer for generating a surface structure on the radiation-curable layer is located generally in direct contact with the radiation-curable layer, and acts such that at the end of the processing steps, there is a surface having a structure or roughness. This may be accomplished by embossing or impressing processes during the production of the layered assembly.

The mask layer allows for the imagewise exposure of the radiation-curable layer and comprises at least one material which absorbs and/or reflects the electromagnetic radiation to be used for exposure, and also a material which allows the mask layer, as a result of the imaging, to be locally either removed and/or so modified in its absorption or reflection properties that the layer becomes at least partially transparent in the wavelength range used for the imaging. The mask layer further comprises additional constituents such as binders and additives which ensure effective processability, film formation, and development. The mask layer is preferably a laser-ablative mask layer. In this case the mask layer is removed by the laser radiation, as a result of the high energy input, removal taking place only at those locations where the laser beam impinges on the mask layer. In this way, a negative image is produced of the relief structure to be generated in the mask layer. Subsequent exposure to electromagnetic waves in the exposed regions of the radiation-sensitive layer results in crosslinking and/or polymerization. Following the removal of the unexposed material, the exposed regions are left as a relief structure. The mask layer is preferably ablated using IR lasers. Generally speaking, exposure is carried out with electromagnetic radiation in the UV range. Laser-ablative mask layers of these kinds are described in WO 94/03839, U.S. Pat. No. 5,262,275, WO 94/03838, and EP 0 767 406, for example.

The laser-ablative mask layer generally comprises one or more water-soluble or water-dispersible binders, or binders that are soluble or dispersible in aqueous/alcoholic solvent mixtures, and comprises finely divided material which absorbs IR light and has a strong absorption in the wavelength range from 750 to 20 000 nm, preferably from 750 to 5000 nm, and optionally comprises a plasticizer. The mask layer sensitive to IR light has an optical density with respect to actinic light of 2.5, preferably between 3 and 5. Examples of such binders are part-hydrolyzed polyvinyl esters, e.g., part-hydrolyzed polyvinyl acetates, polyvinyl alcohol derivatives, such as, for example, part-hydrolyzed vinyl acetate/alkylene oxide graft copolymer, maleic anhydride copolymers such as, for example, copolymers of maleic anhydride and isobutene or maleic anhydride and vinyl methyl ether, water-soluble polyesters, water-soluble polyethers, homo- and copolymers of vinylpyrrolidone, vinylcaprolactam, vinylimidazole, vinyl acetate, acrylamide, water-soluble polyurethanes, polyamides which are water-soluble or soluble in water-alcohol mixtures, or mixtures of these polymers.

IR-absorbing material used may comprise dyes and/or pigments. As dyes it is possible for example to use phthalocyanines and substituted phthalocyanine derivatives, cyanine dyes and merocyanine dyes, or else polymethine dyes. Examples of pigments which can be used include carbon black, graphite, chromium oxide or iron oxides.

The IR-absorbing material is used at the concentration at which it is effective for use in accordance with the invention. Generally speaking, 1 to 60 wt % is needed, based on the total weight of the mask layer sensitive to IR radiation. In order to render the IR-light-sensitive mask layer opaque toward actinic light, it is possible to use any compounds which absorb UV light. Examples are the aforementioned dyes and pigments. The majority of initiators in light-sensitive layers are sensitive toward UV light. Consequently, carbon black is frequently used as a pigment in the IR-light-sensitive layer. When carbon black is used as a pigment in the IR-light-sensitive layer, there is no need to use a further IR-absorbing material. The concentration of the material opaque to actinic light is selected such as to attain the necessary optical density. In general the optical density required is more than 2.5. When carbon black is used as pigment in the IR-light-sensitive layer, the amount used is around 1 to 60 wt %, preferably 1 to 40 wt %, based on the total weight of the IR-light-sensitive mask layer), Another subject of the invention is a method for producing a radiation-curable multilayer element, comprising applying a layer of the radiation-curable mixture to a carrier. This method comprises very generally, in the order a) to g), the steps of
 a) providing a carrier,
 b) optionally cleaning the carrier,
 c) optionally applying one or more further layers, d) applying at least one layer of the radiation-curable mixture, e) optionally further treating the layered assembly, preferably by drying, f) optionally applying one or more further layers, g) optionally further treating the layer construction.

In step a) a dimensionally stable carrier is provided, which may additionally have been provided with further layers (e.g., an adhesion promoter layer, a barrier layer, a coating layer).

In the optional step b), the surface of the carrier is cleaned, and is optionally coated with further layers or directly with the radiation-curable mixture. In the cleaning operation, in particular, dust and foreign particles, but also surface soiling of a kind adversely affecting the adhesion (e.g., fingerprints), are removed. Here is it possible to employ all methods familiar to the skilled person, such as, for example, brushing, blowing off, wiping (with and without solvent), rinsing off, and any desired combinations thereof. Generally speaking, such cleaning is carried out.

In the optional step c), one or more further layers may be applied, as for example an adhesion promoter layer or interlayer, a barrier layer or a coating layer, and also suitable combinations of these layers. The further layers may be applied by any methods familiar to the skilled person, such as, for example, by calendering, laminating, extruding, casting, dipping, spraying, coating or lining, and also suitable combinations thereof. Preferably in step c) a carrier foil or a carrier sheet is coated with an adhesion layer, which is baked or dried. It is also possible to use carrier foils—preferably carrier foils of polyethylene terephthalate, polybutylene terephthalate, polyamide and/or polycarbonate—which have a coating of an adhesion promoter layer.

In step d) at least one layer of the radiation-curable mixture is applied; other operating steps may be carried out between the application of two or more layers, such as, for example, drying, irradiating or spraying, and suitable combinations thereof. The radiation-curable mixture may be applied by any methods familiar to the skilled person, such as, for example, laminating, lining, casting, dipping, spraying, and suitable combinations thereof. It may be necessary here for the radiation-curable mixture and/or the layers to be heated or cooled.

Depending on the method of application in step d), it may be necessary to carry out further treatments of the layer construction in step e). Especially if liquid or solvent-containing mixtures are applied, it may be necessary to carry out drying steps by heating of the layered assembly or evaporation of solvent under reduced pressure. It may also be necessary to subject the layer construction to mechanical treatment, by means of rolls or presses, for example. Moreover, it may be advantageous to irradiate the layer construction at this stage from at least one side, which is correspondingly transparent, with electromagnetic waves.

The radiation-sensitive mixture is preferably applied by casting onto a dimensionally stable metal sheet, made more particularly of aluminum or steel, which comprises the one top coating layer, composed for example of dilute aqueous/alcoholic solution of part-hydrolyzed polyvinyl esters, phenylglycerol ether monoacrylate, and glyoxal, or a dimensionally stable foil, preferably of PET, which has an adhesion layer composed of polyurethane adhesive coating material, in accordance, for example, with DE 3045516 A1, based on polyisocyanate-crosslinking polyether or polyester coating materials, and to dry the applied mixture in a drying tunnel by heating at 50 to 200° C.

The thickness of the applied and optionally treated, radiation-curable layer is generally from 0.01 to 5 mm, preferably 0.01 to 4 mm, more preferably 0.02 to 3 mm, and very preferably 0.03 mm to 3 mm.

In optional step f), one or more further layers may be applied to the radiation-curable, relief-forming layer. Such layers may comprise a protective layer, a barrier layer, a mask layer, an adhesion layer, a release layer, a layer for generating a surface structure, and suitable combinations of these layers. The further layer or layers may be applied by any methods familiar to the skilled person, such as, for example, by calendering, lining, laminating, rolling, extruding, casting, dipping, spraying, and suitable combinations thereof. Here as well it may be necessary to carry out further treatments of the layer construction. Particularly if liquid or solvent-containing mixtures are applied, it may be necessary to carry out drying steps by heating of the layer assembly or evaporation of the solvent under reduced pressure. Generally speaking, at least one protective layer, preferably a protective foil, is applied, its application taking place preferably by laminating or lining.

In one embodiment the radiation-curable mixture may be applied—by casting, for example—to a carrier foil or protective foil, dried, and then laminated onto the metallic or polymeric carrier, in which case solvents may also be employed. It is also possible to apply the radiation-curable mixture to a carrier and to apply the further layer to a foil and then to laminate the foil bearing the further layer onto the radiation-sensitive mixture. If layers or the radiation-curable mixture have been heated in a preceding step, it may be advantageous to carry out active cooling of the layer structure formed.

Optionally the layer construction in step g) may be subjected to further treatments which are advantageous for further processing. These include, for example, exposure to electromagnetic waves of at least one of the two sides of the layer structure (which is correspondingly transparent), an optical quality control for defects and/or impurities, cutting into predetermined formats, thermal treatment, packing, storage, and any desired combinations thereof.

The present invention also relates to a method for producing a relief structure from the radiation-curable multilayer element, comprising irradiating the relief-forming layer through the mask layer and removing the unirradiated, uncured regions of the relief-forming layer.

Very generally, the method comprises the following steps' a) providing the radiation-curable multilayer element, b) optionally cleaning the radiation-curable multilayer element, c) optionally irradiating with electromagnetic radiation from a first side, d) optionally removing a protective layer, e) optionally applying a mask layer, f) imaging the mask layer, g) irradiation with electromagnetic radiation through the mask layer, h) optionally removing the mask layer, i) removing the unirradiated regions, j) optionally further treatment steps.

In the first step a) the radiation-curable multilayer element described is provided. It may optionally be cleaned in step b), in which case all of the methods familiar to the skilled person may be used, such as, for example, brushing, blowing off, wiping (with and without solvent), rinsing off, and any desired combinations thereof.

In the optional step c), the radiation-curable multilayer element is irradiated extensively from at least one side with electromagnetic radiation (see above). This irradiation takes place preferably from the side of the radiation-curable layer that is opposite the mask layer, in order to achieve anchoring of the relief structure to be generated (back-side exposure). This back-side exposure takes place preferably through transparent dimensionally stable materials such as, for example, polymer films, and especially polyester films, as carrier material.

Where a protective layer is present, it may be removed in the optional step d), and this may take place both mechanically and chemically by treatment with solvents, water or aqueous solutions. The protective layer is preferably a protective foil and is peeled off.

If the radiation-curable multilayer element contains no mask layer, this mask layer can be applied in the optional step e). The mask layer here may already have been imaged, in which case step f) is dispensed with. The mask layer may be applied by any methods known to the skilled person, such as, for example, placement, calendering, laminating, rolling, extruding, casting, dipping, spraying, lining, and suitable combinations thereof. Optionally, and particularly when applying liquid formulations, further treatment steps may be necessary, such as drying, rolling and/or cooling, for example. The mask layer is preferably placed on or laminated on.

The sequence of steps b), c),d), and e) may be varied here in a suitable way.

In step f) the mask layer is imaged, and this step is optional only when in step e) an imaged mask layer is applied or the radiation-sensitive layer is exposed directly, as for example by means of guided laser beams or of positionally resolved projection of electromagnetic radiation. The mask layer is imaged either by removal of the layer and/or by positionally resolved alteration in the absorption and/or reflection properties, such that the mask layer becomes at least partially transparent in the wavelength range used for the imaging. Preference is given to using a mask layer which can be ablated by means of IR lasers.

In step g) the multilayer element is irradiated with electromagnetic radiation from the side of the radiation-sensitive layer that is opposite the dimensionally stable material, and the radiation-induced polymerization and crosslinking reaction is set in train. Where an imaged mask is present, irradiation may take place extensively, or, if operating without a mask layer, irradiation may take place in an imaging way over a small area (virtually dotwise) by means of guided laser beams or positionally resolved projection of electromagnetic radiation. The wavelength of the electromagnetic waves irradiated in this case is in the range from 200 to 2000 nm, as already described above.

The irradiation here may take place continuously or in pulsed form or in a plurality of short periods with continuous radiation. The intensity of the radiation here may be varied over a wide range, ensuring that a dose is used which is sufficient to cure the radiation-curable layer sufficiently for the later development procedure. The radiation-induced reaction, possibly after further thermal treatments, must be sufficiently advanced that the exposed regions of the radiation-sensitive layer become at least partially insoluble and therefore cannot be removed in the developing step. The intensity and dose of the radiation are dependent on the reactivity of the formulation and on the duration and efficiency of the developing. The intensity of the radiation is in the range from 1 to 15 000 mW/cm$^2$, preferably in the range from 5 to 5000 mW/cm$^2$, more preferably in the range from 10 to 1000 mW/cm$^2$. The dose of the radiation is in a range from 0.3 to 6000 J/cm$^2$, preferably in a range from 3 to 100 J/cm$^2$, more preferably in the range from 6 to 20 J/cm$^2$. Exposure to the energy source may also be carried out in an inert atmosphere, such as in noble gases, $CO_2$ and/or nitrogen, or under a liquid which does not damage the multilayer element.

In step h), optionally, the mask layer may be removed, and this may be done both mechanically and chemically by treatment with solvents, water, or aqueous solutions. Separate removal of the mask layer is appropriate especially when the layer as a whole can be peeled off mechanically, or if the mask layer has merely been placed on or laminated on. If operating without a mask layer, this step is redundant.

To generate the relief structure, in step i) the regions of the radiation-curable layer not exposed in step g) are removed. In this developing step, all methods familiar to the skilled person may be employed. The irradiation brings about polymerization and/or crosslinking in the radiation-curable layer, causing it to become less soluble. To remove the unexposed regions, therefore, solvents, water and/or aqueous solutions are used as developing media. The solvents and aqueous solutions may comprise auxiliaries which stabilize the formulation and/or which increase the solubility of the components of the radiation-curable layer. Examples of such auxiliaries are emulsifiers, surfactants, salts, acids, bases, stabilizers, corrosion inhibitors, and suitable combinations thereof. Development with these solutions may take place using all of the methods known to the skilled person, such as, for example, dipping, washing or spraying with the developing medium, brushing in the presence of developing medium, and suitable combinations thereof. Development is carried out preferably using neutral aqueous solutions or water, with removal being assisted by rotating brushes or a plush web. Another way of influencing the development is to control the temperature of the developing medium and to accelerate development by raising the temperature, for example. In this step it is also possible for further layers still present on the radiation-sensitive layer to be removed, if these layers can be detached during developing and sufficiently dissolved and/or dispersed in the developer medium.

The preceding steps may optionally be followed by further treatment steps (step j). These include, for example, a thermal treatment, drying, treatment with electromagnetic radiation, attachment of identification features, trimming, coating, and any desired combinations thereof. A thermal treatment may be utilized, for example, to initiate and/or to complete reactions, to increase the mechanical and/or thermal integrity of the relief structure, and to remove volatile constituents. For the thermal treatment it is possible to use the known methods, such as, for example, heating by means of heated gases or liquids, IR radiation, and any desired combinations thereof. Here it is possible for ovens, fans, lamps, and any desired combinations thereof and to be employed.

Treatment with electromagnetic radiation may be used, for example, to make the surfaces of the relief structure tack-free, or to trigger and/or to complete the polymerization and/or crosslinking reactions. The wavelength of the irradiated electromagnetic waves in this case is in the range from 200 to 2000 nm as already described above.

In one embodiment the method for producing a multilayer element having a relief structure from a radiation-curable multilayer element comprises irradiating the relief-forming layer and engraving a relief into irradiated, cured regions of the relief-forming layer. Very generally this method comprises the following steps:

a) providing the radiation-sensitive multilayer element,
b) optionally cleaning the radiation-sensitive multilayer element,
c) optionally irradiating with electromagnetic radiation from the back side,
d) optionally removing a protective layer,
e) irradiating the radiation-curable layer with electromagnetic radiation,
f) imagewise-ablating at least a part of the radiation-curable layer,
g) optionally further treatment steps.

In the first step a) the radiation-curable multilayer element is provided. It may optionally be cleaned in step b), in which case all of the methods familiar to the skilled person may be used, such as, for example, brushing, blowing off, wiping (with and without solvent), rinsing off, and any desired combinations thereof.

In the optional step c), the radiation-curable multilayer element may be irradiated extensively from the back side with electromagnetic waves if this side of the radiation-curable multilayer element is transparent for the wavelengths used. This irradiation takes place from the side of the radiation-sensitive layer that is opposite the mask layer, in order to achieve anchoring of the relief structure to be generated (back-side exposure). This back-side exposure takes place preferably through transparent dimensionally stable materials such as, for example, polymer films, and especially polyester films.

The wavelength of the irradiated electromagnetic waves here is in the range from 200 to 2000 nm, as already described above.

Where a protective layer is present, it may be removed in the optional step d), and this may take place both mechanically and chemically by treatment with solvents, water or aqueous solutions. The protective layer is preferably peeled off.

The sequence of steps b), c), and d) may be varied here in any desired way. In step e) the layer structure is irradiated with electromagnetic waves from the side of the radiation-sensitive layer that is opposite the dimensionally stable material, and the radiation-induced reaction is set in train. Irradiation may take place extensively, or else, irradiation may take place in an imaging way over a small area (virtually dotwise) by means of guided laser beams or by projection of electromagnetic radiation. The wavelength of the electromagnetic waves irradiated in this case is in the range from 200 to 2000 nm, as already described above.

The irradiation here may take place continuously or in pulsed form or in a plurality of short periods with continuous radiation. The intensity of the radiation here may be varied over a wide range, ensuring that a dose is used which is sufficient to modify the radiation-sensitive layer sufficiently for the later use. The radiation-induced reaction, possibly after further thermal treatments, must be sufficiently advanced that the exposed regions of the radiation-sensitive layer are stable. The intensity and dose of the radiation are dependent on the reactivity of the formulation and on the aggressiveness of the developing. The intensity of the radiation is in the range from 1 to 15 000 mW/cm$^2$, preferably in the range from 5 to 5000 mW/cm$^2$, more preferably in the range from 10 to 1000 mW/cm$^2$. The dose of the radiation is in a range from 0.3 to 6000 J/cm$^2$, preferably in a range from 3 to 100 J/cm$^2$, more preferably in the range from 6 to 20 J/cm$^2$. Exposure to the energy source may also be carried out in an inert atmosphere, such as in noble gases, $CO_2$ and/or nitrogen, or under a liquid which does not damage the multilayer element.

The relief structure is completed in step f) by imagewise ablation of at least a part of the radiation-sensitive layer. This can be done by means of mechanical methods or by ablation using high-energy radiation. In the case of the mechanical methods, specific regions of the radiation-sensitive layer are removed with at least one tool, and in this way imaging is achieved. The tools can be controlled using computer-assisted processes. In the case of ablation with high-energy radiation, beams are guided under computer assistance over the radiation-sensitive layer and the material is removed in the irradiated region. The wavelength of the irradiated electromagnetic waves in this case is in the range from 500 nm to 100 µm, preferably in the IR range, more preferably in the range from 500 nm to 50 µm, very preferably in the range from 800 nm to 20 µm. As well as broad-spectrum irradiation of the electromagnetic waves, it may be advantageous to use narrow-spectrum or monochromatic wavelength ranges, of the kind which can be generated using low-pressure, high-pressure, fluorescent and/or flash lamps with corresponding filters, lasers or light-emitting diodes (LEDs). In these cases, wavelengths in the regions of 830 nm, 980 nm, 1064 nm, and 10.6 µm, individually or as combinations, are preferred. Preference is given to using LEDs and fluorescent lamps or fluorescent tubes and combining them arbitrarily with one another. The radiative power in this case is in the range from 1 to 100 W, preferably in the range from 2 to 50 W, more preferably in the range from 5 to 30 W. The dose of the radiation is in the range from 1 to 100 mJ/cm$^2$, preferably in the range from 2 to 80 mJ/cm$^2$, more preferably in the range from 3 to 50 mJ/cm$^2$.

The depth of relief achievable with this process is limited upwardly by the layer thickness of the applied radiation-sensitive layer and is in the range from 10 to 1000 µm, preferably in the range from 20 to 500 µm, more preferably in the range from 30 to 100 µm. The preceding steps may optionally be followed by further treatment steps (step j). These include, for example, a thermal treatment, drying, treatment with electromagnetic radiation, attachment of identification features, trimming, coating, and any desired combinations thereof. A thermal treatment may be utilized, for example, to initiate and/or to complete reactions, to increase the mechanical and/or thermal integrity of the relief structure, and to remove volatile constituents. For the thermal treatment it is possible to use the known methods, such as, for example, heating by means of heated gases or liquids, IR radiation, and any desired combinations thereof. Here it is possible for ovens, fans, lamps, and any desired combinations thereof and to be employed.

Treatment with electromagnetic radiation may be used, for example, to make the surfaces of the relief structure tack-free, or to trigger and/or to complete the polymerization and/or crosslinking reactions. The wavelength of the irradiated electromagnetic waves in this case is in the range from 200 to 2000 nm as already described above.

The invention further relates to the use of the relief structures produced according to the above-stated embodiments, for printing. In this context they can be employed, for example, in letterpress and also gravure processes, and also in pad printing.

The invention is elucidated in more detail by the examples below.

EXAMPLES

Methods
Method for Determining the Degree of Functionalization:
In a first step, the samples for measurement are purified in order to free them of reaction residues, especially monomer.

This is done by purifying around 12 g of sample with 200 g of acetone for 6 h via Soxhlet extraction at 56° C. This is followed by drying under reduced pressure (around 100 mbar) for 2 h at 70° C. A 10% solution of the purified samples in n-propanol/water (w %, n-propanol=50%) is produced, with the exact solids content being recorded. 5 g of this solution are weighed out with 2 g of potassium hydroxide (aq. 2 mol/L) into a 50 mL vessel. The samples are placed in a drying cabinet at 93° C. for 4 h and conditioned. For neutralization, 3 g of hydrochloric acid (2 mol/L) are weighed in. The samples are subsequently shaken for 45 min on an IKA 130 basic shaker (IKA) at 450 rpm. The cap is removed and 35 g of acetone with decanol as internal standard (1500 g acetone/0.51 g 1-decanol) are weighed in. The samples are mixed for 1.5 h on an IKA 130 basic shaker (IKA) at 450 rpm. This solution is dispensed via a 0.25 µm syringe filter into 2 mL GC vials for liquid injection. These vials are placed in the autosampler and analyzed with a TRACE 1300 GC with TriPlus 100LS gas chromatograph (Thermo Fisher Scientific) using the Chromeleon software (Version 7.2.), the output taking place in terms of methacrylic acid (MAA) and acetic acid (acetic) in mg/g. This is done using an FFAP column (Chromatographie Service GmbH) with a length of 50 m, an occupancy of 0.25 mm at 220° C. and 175 kPa, an FID detector, and hydrogen (6.0, Air Liquide) as carrier gas.

The results are evaluated on the assumption that the molar amount of the optionally substituted acrylic acid and the acetic acid corresponds to the molar amounts of the vinyl acrylate and vinyl acetate units, respectively, that are present in the polymer, and that the molar fractions of vinyl alcohol, vinyl acrylate and/or vinyl acetate units add up to 100%. This is illustrated below using vinyl methacrylate as an example. The values of the methacrylic acid (mg/g) and of the acetic acid (mg/g) from the GC analysis are converted for the overall solution of the functional polymer weighed in (in g), with the masses $m_{MAA}$ and $m_{acetic}$ being obtained in g. The molar masses are calculated as follows:

$$n_{MAA} = \frac{m_{MAA}}{M_{MAA}} \text{ and } n_{acetic} = \frac{m_{acetic}}{M_{acetic}} \text{ and therefore}$$

$$n_{vinyl\,alcohol} = \frac{(m_{funct\text{-}PVA} - (n_{vinyl\,acetate} \times M_{vinyl\,acetate}) - (n_{vinyl\,methacrylate} \times M_{vinyl\,methacrylate})}{M_{vinyl\,alcohol}}$$

where $M_{vinyl\,acetate} = 86 \frac{g}{mol}$ $M_{vinyl\,methacrylate} = 112 \frac{g}{mol}$ $$M_{vinyl\,alcohol} = 44 \frac{g}{mol}$$

thus giving, for the degree of functionalization in %:

Degree of functionalization [%] =

$$\frac{n_{vinyl\,methacrylate} \times 100}{n_{vinyl\,methacrylate} + n_{vinyl\,acetate} + n_{vinyl\,alcohol}}$$

Stress-Strain Measurements.

The stress-strain measurements are carried out on exposed, washed, and dried samples (without cover foil and carrier foil, which have been peeled off beforehand), using the total thickness of the plate (that is, the exposure is carried out from the facing side without structuring). The exposure, washout, and drying conditions are reported in the respective tests. After drying, the plates were stored at room temperature overnight and four samples each, with a measurement length of 20 mm and a measurement width of 4 mm, were punched out using a Zwick specimen form 5A (from Zwick Roell AG). It should be ensured here that there are no instances of damage (cracks etc.) and/or foreign bodies (e.g., air bubbles, particles, etc.) present in the samples. The measurements were carried out using a Zwick Roell 72.5 instrument (from Zwick Roell AG) and the testexpert software version V10.0, in a method based on DIN 53504, with a pre-tensioning force of 0.01 MPa and a strain rate of 100 mm/min at room temperature. 4 samples are measured in each case, and the arithmetic means of the elongation at break ER in % and also of the yield stress $\sigma_{max}$ in N/mm² are reported.

Viscosity Measurements for the Part-Hydrolyzed Polyvinyl Acetates

Measurements of the viscosity took place using a falling-ball viscometer according to DIN 53 015 on a 4% aqueous solution at 20° C.

Viscosity Measurement for the Radiation-Sensitive Mixtures

The viscosity measurements took place using a HAAKE Viscotester 550 rotational viscometer with MV measuring cup according to DIN 53019 at 60° C. with a rotary speed of 64 revolutions/min.

Determination of Exposure Time

To determine the exposure time, plates had their protective foil removed and were then exposed for different times using a Nyloprint® Combi CW 35×50 (Flint Group), equipped with TL 09 tubes, and through a test negative (Reprofilm, Köstlin, 1C Testform nyloprint conventional, 2540 dpi, 45° angle). After washout with a Nyloprint® Combi CW 35×50 (Flint Group) using water, and after subsequent drying at 65° C. for 10 minutes, a determination was made of the exposure time for which the 2% halftone screen (59 L/cm) is reproduced without error.

Determination of Washout Time

For determination of the washout time, unexposed plates were washed using water in a Nyloprint® Combi CW 35×50 (Flint Group) until the photosensitive layer was completely removed. The time required to achieve this is reported as the washout time in minutes.

Drying

The washed plates were dried at 65° C. for 10 minutes in a Nyloprint® Combi CW 35×50 (Flint Group) dryer.

Curling Measurements

For determination of the curling, plates measuring 20×20 cm had their protective layer removed and were then exposed using a Nyloprint® Combi CW 35×50 (Flint Group), equipped with TL 09 tubes, for the corresponding time to form the 2% halftone screen (59 L/cm) in minutes (without negative) and developed (corresponding washout time with water for the particular plate) and dried. The plates were subsequently stored at room temperature for 3 days. During this time, the 4 corners of the plates curled upward away from the substrate. At the 2 corners with the highest values, the distance of the corner from the substrate, in millimeters, was measured, and the arithmetic mean of these 2 measurement values was formed and reported.

Evaluation the Printing Results in Relation to the Highlights

Additionally, a printing test was carried out using a UV letterpress ink, UVONOVA (Flint Group). For this test, the printing plates were stretched onto a printing cylinder and printed on a conventional letterpress unit (printing machine: Nilpeter-F 2400). The print substrate was "High Gloss White Premium" paper with one-side coating from Avery Dennison. The printing speed was 25 m/min. The size of the halftone screen was 59 lines/cm. Measurements were made of the tonal value gain (1% to 10% halftone field) of the characteristic print lines in relation to the ideal tonal value original (1:1 curve). The results of the printing test are compiled in Table 4-5 and 6. After printing, the printing plates were inspected for cracks in the solid areas.

Example 1: Preparation of Polymer P1 with 1.0 Mol % Functionalization

In a vessel, with thorough mixing by means of a powerful stirrer, 82.5 parts by weight of polyvinyl acetate pellets (degree of hydrolysis 82%, viscosity: 5 mPas) were admixed with a mixture of 6.6 parts by weight of propylene carbonate, 6.6 parts by weight of ethylene carbonate, 3.3 parts by weight of methacrylic anhydride (VISIOMER MAAH, Evonik Industries, 94% grade), 0.9 part by weight of an esterification catalyst (N-methylimidazole) and 0.1 part by weight of 2,6-di-t-butylcresol as a thermal stabilizer (Kerobit® TBK from BASF, Germany). The mixture is subsequently stirred at a temperature of 85° C. for 5 hours. After this time, free-flowing pellets are obtained which consist of a part-hydrolyzed, subsequently polymer-analogously functionalized polyvinyl acetate, the swelling agents, catalyst, stabilizer, and methacrylic acid.

In accordance with the method described above (in analogy to EP0962828A1), a copolymer with 1.0 mol % vinylmethacrylic acid units, 84.8 mol % vinyl alcohol units and 14.2 mol % vinyl acetate units was obtained.

Example 2: Preparation of Polymer P2 with 1.1 Mol % Functionalization

In analogy to Example 1, a copolymer was prepared, starting from a part-hydrolyzed polyvinyl acetate having a degree of hydrolysis of 88% and a viscosity of 3 mPas. The result obtained was a copolymer with 1.1 mol % vinylmethacrylic acid units, 86.2 mol % vinyl alcohol units and 12.7 mol % vinyl acetate units.

Example 3: Preparation of Polymer P3 with 1.9 Mol % Functionalization

In analogy to Example 1, starting from a part-hydrolyzed polyvinyl acetate (degree of hydrolysis of 82%, viscosity of 5 mPas) a copolymer was obtained with 1.9 mol % vinylmethacrylic acid units, 83.9 mol % vinyl alcohol units and 14.2 mol % vinyl acetate units.

Example 4: Preparation of Polymer P4 with 0.57 Mol % Functionalization

In analogy to Example 1, starting from a part-hydrolyzed polyvinyl acetate (degree of hydrolysis of 82%, viscosity of 5 mPas) a copolymer was obtained with 0.57 mol % vinylmethacrylic acid units, 82.4 mol % vinyl alcohol units and 17.03 mol % vinyl acetate units.

Comparative Example 5: Preparation of Polymer P5 with 3.4 Mol % Functionalization The functionalized polyvinyl acetate was prepared in accordance with DE-A 33 22 994. For this purpose, 50 parts by weight of a part-hydrolyzed polyvinyl acetate (degree of hydrolysis 82 mol %, average molecular weight 30 000 g/mol) were suspended in 150 parts by weight of toluene and then admixed with 8 parts by weight of methacrylic anhydride, 0.4 part by weight of methylimidazole and 0.05 part by weight of Kerobit TBK. The inhomogeneous reaction mixture was stirred at 85° C. for 5 h, after which the reaction product was separated off, washed with toluene and dried at 50° C. for 12 hours in a drying cabinet. This gave a copolymer with 3.4 mol % vinyl(meth)acrylic acid units, 81.0 mol % vinyl alcohol units and 15.6 mol % vinyl acetate units.

TABLE 1

Overview of the part-hydrolyzed functionalized polyvinyl acetates P1 to P4

| | Example 1 P1 | Example 2 P2 | Example 3 P3 | Example 4 P4 | Comparative example P5 |
|---|---|---|---|---|---|
| Vinyl(meth)acrylic acid units | 1.0 | 1.1 | 1.9 | 0.57 | 3.4 |
| Vinyl alcohol units (mol %) | 84.8 | 86.2 | 83.9 | 82.4 | 81.0 |
| Vinyl acetate units (mol %) | 14.2 | 12.7 | 14.2 | 17.03 | 15.6 |

Printing Plate Precursors:

To produce photopolymerizable printing plates, the following procedure is performed with the copolymers obtained as per examples 1 to 5 and with the other constituents:

Corresponding parts by weight (see following examples) of a part-hydrolyzed, subsequently polymer-analogously functionalized polyvinyl acetate (described in examples 1 to 5) and of a polyvinyl alcohol/polyethylene glycol graft copolymer, obtainable by grafting vinyl acetate onto polyethylene glycol with molecular weights of between 1000 and 50 000 and subsequently hydrolyzing to a degree of hydrolysis of between 80 and 100% (described for example in DE 2846647A1), were dissolved in a mixture of 276 parts by weight of water and 184 parts by weight of n-propanol at a temperature of 85° C. and the solution was stirred until it was homogeneous. Subsequently, as ethylenically unsaturated compound, corresponding parts by weight of a phenyl glycidyl ether acrylate (2-hydroxy-3-phenoxypropyl acrylate) and, as initiator, 1.5 parts by weight of benzil dimethyl ketal, as thermal inhibitor 0.3 part by weight of the potassium salt of N-nitrosocyclohexalhydroxylamine, and also, as dye, 0.01 part by weight of safranin T (C.I. 50240) and 0.01 part by weight of acriflavin (C.I. 46000) were added and the solution was stirred at a temperature of 85° C. until it was homogeneous. This solution was then cast onto a foil carrier so as to give a light-sensitive layer 600 μm thick after drying. This material was laminated onto a coated PET foil, and the resulting layer, with a total thickness of 1050 μm, was dried in a drying cabinet at 60° C. for three hours.

The conventional production of printing plates takes place using a photographic negative. For this purpose, the protective foil is first peeled away from the printing plate, after which the photosensitive layer is exposed through a test negative in a UV vacuum exposure unit (Nyloprint® Combi CW 35×50, Flint Group) and washed out with water (see Determination of washout time), dried, and aftertreated.

Example 6: Mixture Comprising Polymer P1 with 1.0 Mol % Functionalization with Hydrogen Bond-Forming Additive (Polyol/Polyether Graft Copolymer)

A photopolymerizable formulation consisting of:
45 parts by weight of the functionalized copolymer P1 prepared in example 1, 20 parts by weight of a polyvinyl alcohol/polyethylene glycol graft copolymer having a degree of hydrolysis of 97% and a viscosity of 5 mPas 33.18 parts by weight of phenyl glycidyl ether acrylate, 1.5 parts by weight of benzil dimethyl ketal, 0.3 part by weight of N-nitrosocyclohexylhydroxylamine, potassium salt, 0.01 part by weight of safranin T (C.I. 50240), 0.01 part by weight of acriflavin (C.I. 46000), was produced as described above and processed into a print precursor. The measured viscosity on application was 3500 mPas (60° C.).

Example 7: Mixture Comprising Polymer P1 with 1.0 Mol % Functionalization with Hydrogen Bond-Forming Additive (Polyol/Polyether Graft Copolymer)

A photopolymerizable formulation consisting of:

45 parts by weight of the functionalized copolymer P1 prepared in example 1, 20 parts by weight of a polyvinyl alcohol/polyethylene glycol graft copolymer having a degree of hydrolysis of 86% and a viscosity of 4 mPas 33.18 parts by weight of phenyl glycidyl ether acrylate, 1.5 parts by weight of benzil dimethyl ketal, 0.3 part by weight of N-nitrosocyclohexylhydroxylamine, potassium salt, 0.01 part by weight of safranin T (C.I. 50240), 0.01 part by weight of acriflavin (C.I. 46000), was produced as described above and processed into a print precursor.

Example 8: Mixture Comprising Polymer P2 with 1.1 Mol % Functionalization with Hydrogen Bond-Forming Additive (Polyol/Polyether Graft Copolymer)

A photopolymerizable formulation consisting of:

55 parts by weight of the functionalized copolymer P2 prepared in example 2, 10 parts by weight of a polyvinyl alcohol/polyethylene glycol graft copolymer having a degree of hydrolysis of 86% and a viscosity of 4 mPas 33.18 parts by weight of phenyl glycidyl ether acrylate, 1.5 parts by weight of benzil dimethyl ketal, 0.3 part by weight of N-nitrosocyclohexylhydroxylamine, potassium salt, 0.01 part by weight of safranin T (C.I. 50240), 0.01 part by weight of acriflavin (C.I. 46000), was produced as described above and processed into a print precursor.

Example 9: Mixture Comprising Polymer P3 with 1.9 Mol % Functionalization with Hydrogen Bond-Forming Additive (Polyol/Polyether Graft Copolymer)

A photopolymerizable formulation consisting of:

45 parts by weight of the functionalized copolymer P3 prepared in example 3, 20 parts by weight of a polyvinyl alcohol/polyethylene glycol graft copolymer having a degree of hydrolysis of 97% and a viscosity of 5 mPas 33.18 parts by weight of phenyl glycidyl ether acrylate, 1.5 parts by weight of benzil dimethyl ketal, 0.3 part by weight of N-nitrosocyclohexylhydroxylamine, potassium salt, 0.01 part by weight of safranin T (C.I. 50240), 0.01 part by weight of acriflavin (C.I. 46000), was produced as described above and processed into a print precursor. The measured viscosity on application was 4770 mPas (60° C.).

Example 10: Mixture Comprising Polymer P3 with 1.9 Mol % Functionalization with Hydrogen Bond-Forming Additive (Polyamine)

A photopolymerizable formulation consisting of:

45.17 parts by weight of the functionalized copolymer P3 prepared in example 3, 17.5 parts by weight of a polyvinyl alcohol/polyethylene glycol graft copolymer having a degree of hydrolysis of 97% and a viscosity of 5 mPas 2.5 parts by weight of a polyethyleneimine (polyamine) having a molecular weight of (GPC) around 25 000 g/mol, a viscosity (50° C., DIN 53015) of around 15 500 mPas and a pH of around 13, 33 parts by weight of phenyl glycidyl ether acrylate, 1.5 parts by weight of benzil dimethyl ketal, 0.3 part by weight of N-nitrosocyclohexylhydroxylamine, potassium salt, 0.01 part by weight of orasol blue (C.I. Solvent Blue 70), 0.02 part by weight of acriflavin (C.I. 46000), was produced as described above and processed into a print precursor. The measured viscosity on application was 4310 mPas (60° C.).

Example 11: Mixture Comprising Polymer P3 with 1.9 Mol % Functionalization with Hydrogen Bond-Forming Additive (Polyamine)

A photopolymerizable formulation consisting of:

45.17 parts by weight of the functionalized copolymer P3 prepared in example 3, 17.5 parts by weight of a polyvinyl alcohol/polyethylene glycol graft copolymer having a degree of hydrolysis of 97% and a viscosity of 5 mPas 2.5 parts by weight of a 50% aqueous solution of a polyethyleneimine (polyamine, cationic) having a viscosity (20° C., ISO 2431, No. 4) of around 100 mPas and a pH of around 11, 33 parts by weight of phenyl glycidyl ether acrylate, 1.5 parts by weight of benzil dimethyl ketal, 0.3 part by weight of N-nitrosocyclohexylhydroxylamine, potassium salt, 0.01 part by weight of orasol blue (C.I. Solvent Blue 70), 0.02 part by weight of acriflavin (C.I. 46000), was produced as described above and processed into a print precursor. The measured viscosity on application was 3920 mPas (60° C.).

Example 12: Mixture Comprising Polymer P3 with 1.9 Mol % Functionalization with Hydrogen Bond-Forming Additive (Polyurethane)

A photopolymerizable formulation consisting of:

43 parts by weight of the functionalized copolymer P3 prepared in example 3, 20 parts by weight of a polyvinyl alcohol/polyethylene glycol graft copolymer having a degree of hydrolysis of 97% and a viscosity of 5 mPas 2.0 parts by weight of a polyurethane acrylate PUA BIN 200 (BASF)
33.18 parts by weight of phenyl glycidyl ether acrylate,
1.5 parts by weight of benzil dimethyl ketal,
0.3 part by weight of N-nitrosocyclohexylhydroxylamine, potassium salt,
0.01 part by weight of safranin T (C.I. 50240),
0.01 part by weight of acriflavin (C.I. 46000),
was produced as described above and processed into a print precursor. The measured viscosity on application was 4670 mPas (60° C.).

Example 13: Mixture Comprising Polymer P3 with 1.9 Mol % Functionalization with Hydrogen Bond-Forming Additive (Polyol)

A photopolymerizable formulation consisting of:
45 parts by weight of the functionalized copolymer P3 prepared in example 3,
20 parts by weight of a polyvinyl alcohol/polyethylene glycol graft copolymer having a degree of hydrolysis of 97% and a viscosity of 5 mPas
6.5 parts by weight of glycerol,
33.17 parts by weight of phenyl glycidyl ether acrylate,
1.5 parts by weight of benzil dimethyl ketal,
0.3 part by weight of N-nitrosocyclohexylhydroxylamine, potassium salt,
0.02 part by weight of orasol blue (C.I. Solvent Blue 70),
0.01 part by weight of acriflavin (C.I. 46000),
was produced as described above and processed into a print precursor. The measured viscosity on application was 3990 mPas (60° C.).

Example 14: Mixture Comprising Polymer P3 with 1.9 Mol % Functionalization with Hydrogen Bond-Forming Additive (Polyether)

A photopolymerizable formulation consisting of:
45 parts by weight of the functionalized copolymer P3 prepared in example 3,
20 parts by weight of a PEG 400 polymer (polyethylene glycol),
33.18 parts by weight of phenyl glycidyl ether acrylate,
1.5 parts by weight of benzil dimethyl ketal,
0.3 part by weight of N-nitrosocyclohexylhydroxylamine, potassium salt,
0.01 part by weight of safranin T (C.I. 50240),
0.01 part by weight of acriflavin (C.I. 46000),
was produced as described above and processed into a print precursor. The measured viscosity on application was 4340 mPas (60° C.).

Example 15 Mixture Comprising Polymer P5 with 3.4 Mol % Functionalization with Hydrogen Bond-Forming Additive (Polyol/Polyether Graft Copolymer)

A photopolymerizable formulation consisting of:
45 parts by weight of the functionalized copolymer P5 prepared in example 5,
20 parts by weight of a polyvinyl alcohol/polyethylene glycol graft copolymer having a degree of hydrolysis of 97% and a viscosity of 5 mPas
33.18 parts by weight of phenyl glycidyl ether acrylate,
1.5 parts by weight of benzil dimethyl ketal,
0.3 part by weight of N-nitrosocyclohexylhydroxylamine, potassium salt,
0.01 part by weight of safranin T (C.I. 50240),
0.01 part by weight of acriflavin (C.I. 46000),
was produced as described above and processed into a print precursor.

Comparative Example 16: Mixture Comprising Polymer P5 with 3.4 Mol % Functionalization with Hydrogen Bond-Forming Additive (Polyol/Polyether Graft Copolymer)

A photopolymerizable formulation consisting of:
24 parts by weight of the functionalized copolymer P5 prepared in example 5,
24 parts by weight of a polyvinyl alcohol/polyethylene glycol graft copolymer having a degree of hydrolysis of 97% and a viscosity of 5 mPas
21.84 parts by weight of part-hydrolyzed polyvinyl acetate (degree of hydrolysis 88%, viscosity of 3 mPas),
28 parts by weight of phenyl glycidyl ether acrylate,
1.5 parts by weight of benzil dimethyl ketal,
0.4 part by weight of N-nitrosocyclohexylhydroxylamine, potassium salt,
0.01 part by weight of safranin T (C.I. 50240),
0.25 part by weight of BYK 370 (BYK-Chemie GmbH),
was produced as described above and processed into a print precursor. The measured viscosity on application was 7500 mPas (60° C.).

Examples without Hydrogen Bond-Forming Additive (Polyol/Polyether Graft Copolymer)

Example 17. Mixture Comprising Polymer P1 with 1.0 Mol % Functionalization

A photopolymerizable formulation consisting of:
65 parts by weight of the functionalized copolymer P1 prepared in example 1,
33.18 parts by weight of phenyl glycidyl ether acrylate,
1.5 parts by weight of benzil dimethyl ketal,
0.3 part by weight of N-nitrosocyclohexylhydroxylamine, potassium salt,
0.01 part by weight of safranin T (C.I. 50240),
0.01 part by weight of acriflavin (C.I. 46000),
was produced as described above and processed into a print precursor.

Example 18: Mixture Comprising Polymer P3 with 1.9 Mol % Functionalization

A photopolymerizable formulation consisting of:
65 parts by weight of the functionalized copolymer P3 prepared in example 3,
33.18 parts by weight of phenyl glycidyl ether acrylate,
1.5 parts by weight of benzil dimethyl ketal,
0.3 part by weight of N-nitrosocyclohexylhydroxylamine, potassium salt,
0.01 part by weight of safranin T (C.I. 50240),
0.01 part by weight of acriflavin (C.I. 46000),
was produced as described above and processed into a print precursor.

Comparative Example 19: Mixture Comprising Polymer P5 with 3.4 Mol % Functionalization A photopolymerizable formulation consisting of:
65 parts by weight of the functionalized copolymer P5 prepared in example 5,
33.18 parts by weight of phenyl glycidyl ether acrylate,
1.5 parts by weight of benzil dimethyl ketal,
0.3 part by weight of N-nitrosocyclohexylhydroxylamine, potassium salt,
0.01 part by weight of safranin T (C.I. 50240),
0.01 part by weight of acriflavin (C.I. 46000),
was produced as described above and processed into a print precursor,

Example 20: Mixture Comprising Polyvinyl Alcohol without Functionalization

A photopolymerizable formulation consisting of:
65 parts by weight of part-hydrolyzed polyvinyl acetate (degree of hydrolysis 82%, viscosity 5 mPas),
33.18 parts by weight of phenyl glycidyl ether acrylate,
1.5 parts by weight of benzil dimethyl ketal,
0.3 part by weight of N-nitrosocyclohexylhydroxylamine, potassium salt,
0.01 part by weight of safranin T (C.I. 50240),
0.01 part by weight of acriflavin (C.I. 46000),
was produced as described above and processed into a print precursor.

TABLE 2a

Photopolymerizable formulations with hydrogen bond-forming additive, standardized to comparative example 16

|  | Example 6 | Example 7 | Example 8 | Example 9 | Comparative example 15 | Comparative example 16 |
|---|---|---|---|---|---|---|
| Vinyl(meth)acrylic acid units (mol %) | 1.0 | 1.0 | 1.1 | 1.9 | 3.4 | 3.4 |
| Vinyl alcohol units (mol %) | 84.8 | 84.8 | 86.2 | 83.9 | 81.0 | 81.0 |
| Vinyl acetate units (mol %) | 14.2 | 14.2 | 12.7 | 14.2 | 15.6 | 15.6 |
| Graft copolymer additive (wt %) | 20 | 20 | 10 | 20 | 20 | 24 |
| Additive | polyol | polyol | polyol | polyol | polyol | polyol |
| Curling * | 0.42 | 0.5 | 0.64 | 0.13 | 1.10 | 1.00 |
| Exposure time * | 1.00 | 0.86 | 1.43 | 0.86 | 0.86 | 1.00 |
| Washing time * | 0.88 | 1.00 | 0.63 | 0.88 | 1.00 | 1.00 |
| Quality after washing | good | good | satis. | very good | good | good |
| Well depth * | 1.29 | 1.19 | 1.00 | 1.52 | 1.38 | 1.00 |
| Printing behavior | good | good | — | very good | satis. | satis. |
| $\delta_{max}$ * | 0.41 | 0.46 | — | 0.51 | 0.74 | 1.00 |
| $\varepsilon R$ * | 1.70 | 1.80 | — | 1.19 | 0.81 | 1.00 |

* standardized to comparative example 16

As is evident from Table 2a, all of examples 6 to 9 exhibit relatively low curling, unchanged or lower exposure and washing times, greater well depths, better printing behavior, lower yield stress and hence higher elasticity and higher tensile strength.

TABLE 2b

Photopolymerizable formulations with hydrogen bond-forming additive, standardized to comparative example 16

|  | Example 10 | Example 11 | Example 12 | Example 13 | Example 14 | Comparative example 16 |
|---|---|---|---|---|---|---|
| Vinyl(meth)acrylic acid units (mol %) | 1.9 | 1.9 | 1.9 | 1.9 | 1.9 | 3.4 |
| Vinyl alcohol units (mol %) | 83.9 | 83.9 | 83.9 | 83.9 | 83.9 | 81.0 |
| Vinyl acetate units (mol %) | 14.2 | 14.2 | 14.2 | 14.2 | 14.2 | 15.6 |
| Total additives (wt %) | 20 | 20 | 22 | 26.5 | 20 | 24 |
| Additive | polyamine, polyol | polyamine, polyol | polyol, polyamide | polyol | polyol | polyol |
| Curling * | 0.25 | 0.22 | 0.21 | 0.13 | 0.17 | 1.00 |
| Exposure time * | 1.00 | 1.14 | 1.14 | 1.43 | 1.00 | 1.00 |
| Washing time * | 1.00 | 1.25 | 1.13 | 0.75 | 1.00 | 1.00 |
| Quality after washing | good | good | good | good | satis. | good |

TABLE 2b-continued

Photopolymerizable formulations with hydrogen bond-forming additive, standardized to comparative example 16

|  | Example 10 | Example 11 | Example 12 | Example 13 | Example 14 | Comparative example 16 |
|---|---|---|---|---|---|---|
| Well depth * | 1.04 | 0.93 | 1.13 | 1.28 | 1.41 | 1.00 |
| Printing behavior | good | good | good | good | satis. | satis. |
| $\delta_{max}$ * | — | 0.34 | 0.50 | — | — | 1.00 |
| $\varepsilon R$ * | — | 0.81 | 1.02 | — | — | 1.00 |

* standardized to comparative example 16

As is evident from Table 2b, all of examples 10 to 14 exhibit relatively low curling, unchanged or lower exposure and washing times, greater well depths, better printing behavior, lower yield stress and hence higher elasticity and higher tensile strength.

TABLE 3

Photopolymerizable formulation without hydrogen bond-forming additive, standardized to comparative example 16

|  | Example 17 | Example 18 | Comparative example 19 | Comparative example 20 | Comparative example 16 |
|---|---|---|---|---|---|
| Vinyl(meth)acrylic acid units (mol %) | 1.0 | 1.9 | 3.4 | 0 | 3.4 |
| Vinyl alcohol units (mol %) | 84.8 | 83.9 | 81.0 | 18.0 | 81.0 |
| Vinyl acetate units (mol %) | 14.2 | 14.2 | 15.6 | 82.0 | 15.6 |
| Curling * | 0.29 | 0.14 | 1.18 | nm | 1.00 |
| Exposure time * | 0.86 | 1.00 | 1.14 | >1.43§ | 1.00 |
| Washing time * | 1.38 | 1.50 | 1.63 | 0.88 | 1.00 |
| Quality after washing | good | good | satis. | very poor | good |
| Well depth * | 1.45 | 1.17 | 1.36 | nm | 1.00 |
| Printing behavior | good | good | satis. | nm | satis. |
| $\delta_{max}$ * | 0.72 | 0.52 | 1.21 | 0.4 | 1.00 |
| $\varepsilon R$ * | 0.97 | 0.80 | 0.61 | 1.95 | 1.00 |

* standardized to comparative example 16
nm = not measurable
§ no stable halftone field/screen is formed As is evident from Table 3, all of examples 17 and 18 exhibit relatively low curling, unchanged or lower exposure and washing times, greater well depths, better printing behavior, lower yield stress and hence higher elasticity and higher tensile strength. Only comparative example 20, without functionalization, shows no stably formed halftone field (ablated by the brushes during washout) and therefore does not allow further data to be measured either.

TABLE 4

Direct comparison of the photopolymerizable formulations with and without hydrogen bond-forming additive

|  | Example 6 | Example 7 | Example 17 | Example 9 | Example 18 |
|---|---|---|---|---|---|
| Funct. PVA | P1 | P1 | P1 | P3 | P3 |
| Hydrogen bond additive | polyether, polyol | polyether, polyol | — | polyether, polyol | — |
| Curling * | 0.42 | 0.5 | 0.29 | 0.13 | 0.14 |
| Exposure time * | 1.00 | 0.86 | 0.86 | 0.86 | 1.00 |

TABLE 4-continued

Direct comparison of the photopolymerizable formulations with and without hydrogen bond-forming additive

|  | Example 6 | Example 7 | Example 17 | Example 9 | Example 18 |
|---|---|---|---|---|---|
| Washing time * | 0.88 | 1.00 | 1.38 | 0.88 | 1.50 |
| Quality after washing | good | good | good | very good | good |
| Well depth * | 1.29 | 1.19 | 1.45 | 1.52 | 1.17 |
| Printing behavior | good | good | good | very good | good |
| Cracking | crack-free | little | moderate | crack-free | little |
| $\delta_{max}$ * | 0.41 | 0.46 | 0.72 | 0.51 | 0.52 |
| $\varepsilon R$ * | 1.70 | 1.80 | 0.97 | 1.19 | 0.80 |

* standardized to comparative example 16

A comparison of the results (Table 4) of the formulations with P1 from examples 6 and 7 (with hydrogen bond-forming additive) with example 17 (without additive), and of formulations of example 9 with example 18 (without additive), shows that the addition of hydrogen bond-forming additive results in a shorter washout time, less cracking during printing, lower yield stress and hence higher elasticity and also a higher tensile strength.

TABLE 5

Measured tonal values (printing results) of analog plates of examples 6 to 16

| TV original | Example 6 (P1) | Example 7 (P1) | Example 9 (P3) | Example 15 (P5) | Comparative example 16 (P5) |
|---|---|---|---|---|---|
| 1.00% | — | 1.5% | 7.0% | — | 14.2% |
| 2.00% | 4.5% | 3.2% | 9.2% | 8.5% | 19.6% |
| 3.00% | 8% | 5.1% | 9.3% | 10% | 23.4% |
| 4.00% | 13.2% | 7% | 9.9% | 11.9% | 23.4% |
| 5.00% | 16.5% | 9.3% | 11.4% | 12.6% | 26.5% |
| 10.00% | 22.3% | 17.7% | 19.0% | 21.3% | 30.6% |

Table 5 shows that in particular the low tonal values are better maintained and the deviations relative to the target value are smaller.

Example 21: Digital Plates

Digital photopolymerizable printing plates are produced with polymers from examples 1 to 5 and photopolymerizable formulations produced from them, of examples 6 to 16, but with the application of a laser-ablatable mask layer, which was obtained from a suspension consisting of 2 parts of carbon black (Printex U from Orion Engineered Carbons GmbH) and 8 parts of a part-hydrolyzed polyvinyl acetate (KP 5-88 from Kuraray) in 80 parts of water and 20 parts of n-propanol.

The plates were mounted onto the drum of an IR laser (ESKO CDI Spark 2530) and laser-treated. The laser-treated motif corresponded to the test negative from the preceding examples. Exposure then took place in a UV vacuum exposure unit (Nyloprint® Combi CW 35×50, Flint Group) and was followed by washout with water, drying, and aftertreatment.

Ultimately, the digital plates with laser-ablatable mask layer behaved similarly to the conventional plates and, in comparison to the comparative formulations, exhibited significant improvements (higher resolution, reduced curling, unchanged or lower exposure and washing times, higher well depths, better printing behavior, higher elasticity, and higher tensile strength).

TABLE 6

Measured tonal values (printing results) of digital plates of examples 6, 9 and 16

| Tonal value original | Example 6 | Example 9 | Comparative example 16 |
|---|---|---|---|
| 1.00% | 2.4% | 2.4% | 2.4% |
| 2.00% | 4.0% | 3.9% | 5.5% |
| 3.00% | 6.1% | 4.7% | 6.9% |
| 4.00% | 7.6% | 6.2% | 7.0% |
| 5.00% | 9.8% | 8.4% | 9.2% |
| 10.00% | 20.0% | 15.5% | 15.5% |

Table 6 shows that in particular the low tonal values are better maintained and the deviations relative to the target value are smaller.

Example 22: Laser Engraving

Plates according to example 3, functionalized PVA from KP 5-82 with 1.9 mol % functionalization, were produced as described above and processed to give a print precursor.

A photopolymerizable formulation consisting of:
58.78 parts by weight of the functionalized copolymer P3 prepared in example 3
33.4 parts by weight of glycerol dimethacrylate
5.2 parts by weight of finely ground quartz with an average grain size of 3 μm
2.0 parts by weight of benzil dimethyl ketal
0.6 part by weight of N-nitrosocyclohexylhydroxylamine, potassium salt
0.01 part by weight of safranin T (C.I. 50240).
0.01 part by weight of acriflavin (C.I. 46000).

UV exposure took place for 2.5 minutes using a nyloprint combi CW 35×50 exposure unit. The plates were then mounted onto the drum of a CO₂ laser (Agrios, Stork Prints Austria GmbH) and laser-treated with a resolution of 2032 dpi. The laser-treated motif included various halftone wedges, with the resolution of the halftone screen selected being 60 L/cm. The surface coverage was varied from 70 to 90%. Surface coverage in pad printing refers to the percentage area removed by engraving, in comparison to the total area.

The power of the laser was 500 watts. The optimum distinctness of image was achieved at a rotary speed of 250 revolutions per minute.

The engraved plates were subsequently mounted on a pad printing machine (Morlock, closed blade pot). The pad printing ink used was a solvent-based pad printing ink, Marabu TPY980 (white). The ink contains hydrocarbons, ketones, and acetates as solvents. The curing agent added was 10% isocyanate curing agent H1 from Marabu. On printing onto the printing body, it was possible with all of the plates to image fine elements up to a surface coverage of 90%.

The invention claimed is:

1. A radiation-curable mixture for generating relief structures, comprising
a) an ethylenically unsaturated compound as component A, said compound being a functionalized, part-hydrolyzed polyvinyl acetate comprising (i) vinyl alcohol units, (ii) vinyl acetate units, and (iii) vinyl acrylate units, where the vinyl acrylate units, which can be substituted, have the general structure

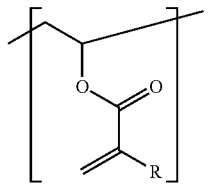

wherein the amount of vinyl acrylate units (iii) in the functionalized, part-hydrolyzed polyvinyl acetate a), based on all the units (i), (ii), and (iii), is 0.1 to <3 mol %, where R is hydrogen or a linear or branched aliphatic or heteroaliphatic radical, or a cycloaliphatic, heterocyclic or aromatic radical having up to 12 carbon atoms;
b) an initiator or initiator system as component B,
c) an ethylenically unsaturated compound different from component A, as component C,
d) an additive capable of hydrogen bonding, as component D,
said additive being present in an amount of 1 to 30 wt %, based on the sum of all components in the radiation-curable mixture;
wherein the additive capable of hydrogen bonding is selected from the group consisting of polyvinyl alcohol, polyvinyl acetate, polyethyleneimine, polyurethanes, polyethylene glycol, and polyvinyl alcohol/polyethylene glycol graft copolymer.

2. The radiation-curable mixture as claimed in claim 1, wherein the amount of vinyl alcohol units (i) in component A, based on all the units (i), (ii), and (iii), is 65 to 99 mol %.

3. The radiation-curable mixture as claimed in claim 1, wherein the amount of vinyl acetate units (ii) in component A, based on all the units (i), (ii), and (iii), is 5 to 35 mol %.

4. The radiation-curable mixture as claimed in claim 1, wherein component A is present in an amount of 5 to 75 wt %, based on the sum of components A to D.

5. The radiation-curable mixture as claimed in claim 1, wherein component B is present in an amount of 0.1 to 20 wt %, based on the sum of components A to D.

6. The radiation-curable mixture as claimed in claim 1, wherein the ethylenically unsaturated compound of component C comprises at least one vinyl ether group and/or acrylate group and/or methacrylate group.

7. The radiation-curable mixture as claimed in claim 1, wherein component C is present in an amount of 0.5 to 50 wt %, based on the sum of components A to D.

8. The radiation-curable mixture as claimed in claim 1, wherein the additives are selected from the group consisting of plasticizers, solvents, further binders, colorants, stabilizers, chain transfer agents, UV absorbers, dispersing assistants, non-radically crosslinking crosslinkers, viscosity modifiers, and hydrogen bond-accepting additives.

9. The radiation-curable mixture as claimed in claim 1, wherein component D is present in an amount of 1 to 25 wt %, based on the sum of components A to D.

10. A radiation-curable multilayer element at least comprising a relief-forming layer of the radiation-curable mixture as claimed in claim 1 on a carrier.

11. The radiation-curable multilayer element as claimed in claim 10, comprising, on or under the relief-forming layer, at least one further layer selected from the group consisting of a protective layer, a release layer, a mask layer, a barrier layer, a layer for generating a surface structure, and a tie layer or any desired combinations thereof.

12. A method for producing the multilayer element having a relief structure from a radiation-curable multilayer element as claimed in claim 10, comprising irradiating the relief-forming layer through an integral or appliable mask layer and removing the uncured regions of the relief-forming layer.

13. A method for producing the multilayer element having a relief structure from a radiation-curable multilayer element as claimed in claim 10, comprising irradiating the relief-forming layer and engraving a relief into cured regions of the relief-forming layer.

14. A radiation-curable mixture for generating relief structures, comprising
   a) a functionalized, part-hydrolyzed polyvinyl acetate as component A, comprising (i) vinyl alcohol units, (ii) vinyl acetate units, and (iii) vinyl acrylate units, where the vinyl acrylate units, which can be substituted, have the general structure

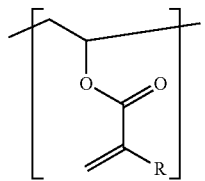

wherein the amount of vinyl acrylate units (iii) in the functionalized, part-hydrolyzed polyvinyl acetate a), based on all the units (i), (ii), and (iii), is 0.1 to <3 mol %;
   where R is chosen from:
      a hydrogen,
      a linear aliphatic or heteroaliphatic radical having 1 to 12 carbon atoms,
      a branched aliphatic having 3 to 12 carbon atoms,
      a heteroaliphatic radical having 2 to 12 carbon atoms,
      a cycloaliphatic, heterocyclic having 3 to 12 carbon atoms or
      an aromatic radical having 4 to 12 carbon atoms,
   b) an initiator or initiator system, as component B,
   c) an ethylenically unsaturated compound, as component C,
   d) an additive capable of hydrogen bonding, as component D, wherein said additive forms hydrogen bonds with the hydrolyzed polyvinyl acetate and wherein component D is present in an amount of 1 to 30 wt %, based on all components within the radiation-curable mixture, said component D being selected from the group consisting of alcohols, ketones, aldehydes, amines, amides, amino acids, carboxylic acids, thioethers, thiols, urethanes, esters, lactones, lactams, and combinations thereof.

15. The radiation-curable mixture as claimed in claim 1, wherein component D is present in an amount of 5 to 20 wt %, based on the sum of components A to D.

16. The radiation-curable mixture as claimed in claim 1, wherein component D is present in an amount of 10 to 20 wt %, based on the sum of components A to D.

17. The radiation-curable mixture as claimed in claim 1, wherein
   component A is present in an amount of 5 to 75 wt %, based on the sum of components A to D,
   component B is present in an amount of 0.1 to 20 wt %, based on the sum of components A to D,
   component C is present in an amount of 0.5 to 50 wt %, based on the sum of components A to D, and
   component D is present in an amount of 1 to 25 wt %, based on the sum of components A to D.

18. The radiation-curable mixture as claimed in claim 14, wherein
   component A is present in an amount of 5 to 75 wt %, based on the sum of components A to D,
   component B is present in an amount of 0.1 to 20 wt %, based on the sum of components A to D,
   component C is present in an amount of 0.5 to 50 wt %, based on the sum of components A to D, and
   component D is present in an amount of 1 to 25 wt %, based on the sum of components A to D.

19. The radiation-curable mixture as claimed in claim 1, wherein
   R is an aliphatic radical chosen from a linear or branched C1-C12 alkyl substituted by at least one halogen, hydroxyl, mercapto, ether, amine, carboxylic acid, ester, urethane, aldehyde, nitro, CF3, a cyano group or substituted with a C1-C4 alkyl; or wherein
   R is a cycloaliphatic radical chosen from a cyclohexyl, cyclopentyl, cyclobutyl, cyclopropyl, cyclopetatadiene, decalin, adamantane, or camphor radical; or wherein
   R is a heterocyclic radical chosen from a 2-pyrrolidine, tetrahydrofuran, tetrahydrothiophene, pyran, thiopyran, pyrazole, imidazole, piperidine, or morpholine radical; or wherein
   R is an aromatic or heteroaromatic radical chosen from a phenyl, benzyl, pyridine, naphthyl, pyrrole, furan, thiophene, pyridine, pyrazole, benzimidazole, indole, isoquinoline, purine, pyrimidine, oxazole, or thioazole radical.

* * * * *